United States Patent
Yamashita et al.

(10) Patent No.: US 6,505,322 B2
(45) Date of Patent: Jan. 7, 2003

(54) LOGIC CIRCUIT DESIGN METHOD AND CELL LIBRARY FOR USE THEREWITH

(75) Inventors: Shunzo Yamashita, Tokyo (JP); Kazuo Yano, Hino (JP); Naoki Kato, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/904,661

(22) Filed: Jul. 16, 2001

(65) Prior Publication Data

US 2002/0049955 A1 Apr. 25, 2002

(30) Foreign Application Priority Data

Sep. 6, 2000 (JP) ........................... 2000-274986

(51) Int. Cl.[7] .............................................. G06F 17/50
(52) U.S. Cl. ............................................. 716/1; 716/16
(58) Field of Search ........................................ 716/1, 16

(56) References Cited

U.S. PATENT DOCUMENTS 4,724,531 A * 2/1988 Angleton et al. ............ 365/189
6,124,736 A    9/2000 Yamashita et al. .......... 326/113

FOREIGN PATENT DOCUMENTS

JP    11-161470    11/1997

OTHER PUBLICATIONS

Robert K. Brayton, Richard Rudell, Alberto Sangiovanni–Vincentelli and Albert R. Wang, "MIS: A Multiple–Level Logic Optimization System," IEEE Transactions on computer–Aided Design, vol. Cad 6, No. 6, Nov. 1987, pp. 1062–1081.

Shunzo Yamashita, Naoki Katoh, Yasuhiko Sasaki, Yohei Akita, Hidetoshi Chikata and Kazuo Yano, "Hole–Filling: A Novel Delay Reduction Technique Using Selector Logic," IEEE 1998 Custom Integrated Circuits Conference, pp 291–294.

* cited by examiner

Primary Examiner—M. T Tran

(57) ABSTRACT

A method, system, and library for generating high-speed logic circuits with reduced path depths even in cases when a critical path diverges into a plurality of paths that eventually converge. By replacing the gates of a logic circuit by selectors with two inputs and one output, a selector-based circuit is generated where a local circuit between the path divergence node and convergence node is detected. The stages of the critical path are reduced by replacing the local circuit by a logically equivalent selector with two inputs and one output; wherein one input of the selector is controlled by a circuit formed by inputting a logical value of "0" to the divergence node from which the local circuit is developed and a second input of the selector is controlled by a circuit formed by inputting a logical value of "1" to the divergence node.

19 Claims, 23 Drawing Sheets

→ : CRITICAL PATH

3 STAGES
→ : CRITICAL PATH

※ NOTES
ARRIVAL TIME
REQUIRED TIME
SLACK

ARRIVAL TIME=DELAY OF INPUT SIGNAL+DELAY OF ALL CELLS ON A PATH-1
REQUIRED TIME=CONSTRAINT OF OUTPUT SIGNAL-DELAY OF ALL CELLS ON A PATH-2
SLACK=REQUIRED TIME-ARRIVAL TIME

4 STAGES

FIG. 12

| | CIRCUITRY | NAME/LOGIC FUNCTION | DELAY/ SIZE | TRANSISTOR CIRCUIT |
|---|---|---|---|---|
| 1 | G100<br>I1—▷∘—O1 | INV/<br>O1=I1' | 0.1ns/<br>50 μm² | C100 (T100, T101) |
| 2 | G110<br>I1, I2 —O1 | 2NAND/<br>O1=(I1·I2)' | 0.2ns/<br>100 μm² | C110 (T110, T111, T112, T113) |
| 3 | G120<br>I1, I2 —O1 | 2NOR/<br>O1=(I1+I2)' | 0.2ns/<br>100 μm² | C120 (T120, T121, T122, T123) |
| 4 | G130<br>I1, I2 —O1 | 2AND/<br>O1=I1·I2 | 0.3ns/<br>150 μm² | C130 (T130, T131, T132, T133, T134, T135) |
| 5 | G140<br>I1, I2 —O1 | 2OR/<br>O1=I1+I2 | 0.3ns/<br>150 μm² | C140 (T140, T131, T140, T141, T142, T143) |
| 6 | G150<br>I1, I2, I3 —O1 | 2IOR_NAND/<br>O1=((I1+I2)·I3)' | 0.3ns/<br>150 μm² | C150 (T150, T151, T152, T153, T154, T155) |
| 7 | G160<br>I1, I2, I3, I4 —O1 | 22AND_OR/<br>O1=I1·I2+ I3·I4 | 0.5ns/<br>300 μm² | C160 (T160, T161, T162, T163, T164, T165, T166, T167, T168, T169) |
| ⋮ | ⋮ | ⋮ | ⋮ | ⋮ |

LOGIC CIRCUIT DESIGN METHOD AND CELL LIBRARY FOR USE THEREWITH

PRIORITY TO FOREIGN APPLICATIONS

This application claims priority to Japanese Patent Application No. P2000-274986.

BACKGROUND OF THE INVENTION

1. Field of the Invention

The present invention relates to a method of improving the delay characteristics of existing logic circuits, thereby providing logic circuits operating at a faster speed, and a method of synthesizing high-speed logic circuits by using a Hardware Description Language (HDL) such as Verilog or VHDL.

2. Description of the Background

Many study results about methods for making logic circuits operate at faster speeds by modifying existing logic circuits have been published.

The maximum operating speed of a circuit depends upon the delay of a path called a critical path for which the longest delay is observed when a signal from the input terminal of the circuit is carried across the path to the output terminal. Thus, it is important to reduce the critical path delay. For example, in IEEE Transactions on Computer-Aided Design, Vol. CAD-6, No. 6, pp. 106201981 (1987)("reference 1"), a method for increasing the speed of a circuit is described which applies the following two methods to all gates constituting a critical path:

(1) The first method optimizes the gate drive capability (inserting a buffer as required), whereby the delay per gate is reduced for all gates along the critical path.

(2) The second method applies circuit restructuring based on Boolean equations to each circuit comprising a plurality of gates along the path, thereby reforming the entire circuit into one with shorter depth of the critical path, that is, the path comprises a decreased number of stages. In this way, the number of stages, or the depth of the critical path, can be reduced, and the path delay will decrease.

By applying the above two methods repeatedly, a logic circuit operating at a faster speed may be obtained.

In Japanese Patent Laid-Open Publication No. Hei 11-161470 ("reference 2"), a method for increasing the speed of a logic circuit utilizing a path depth reduction method based on selectors was introduced. In this method, AND gates and OR gates that constitute a logic circuit are translated into logically equivalent selectors with two inputs and one output. Thus, the logic circuit is transformed into one comprising the selectors with two inputs and one output. Then, a critical path is detected in the resulting selector-based circuit. The detected critical path is separated into sections of two selector stages, and the path depth is reduced by applying a path depth reduction pattern that transforms the two stages into a one stage path section. Finally, all selectors are converted into pass transistor selectors with two inputs and one output, each of which comprises a pass-transistor circuit. In this way, a high-speed pass-transistor circuit with the same logical function as the original logic circuit is obtained.

The reference describes a path depth reduction method based on selectors by which two stages in path sections can be reduced to one stage in any kind of circuit. Thus, path depth reduction is possible for a circuit for which it is impossible to apply such circuit transformation based on Boolean equations as described in reference 1, and a resulting increase in circuit speed may be expected. In reference 2, in fact, an example case was introduced where a logic circuit operating three times as fast as the original circuit was successfully created.

Furthermore, in Proceeding of IEEE 1998 Custom Integrated Circuits Conference, pp. 291–294, ("reference 3"), another method was introduced. In this method, after a logic circuit is replaced by the corresponding circuit comprising selectors with two inputs and one output and path depth reduction processing based on selectors is performed as in the method of reference 2, the selectors with two inputs and one output are mapped to a CMOS logic circuit consisting of AND/OR gates by an existing logic circuit synthesis tool.

According to reference 3, the depth reduction processing based on selectors is so powerful that a sufficient increase in circuit speed can be expected even if the selectors are eventually mapped again onto the CMOS logic circuit. In fact, an exemplary case was introduced where the method of reference 3 enabled the circuit to operate at double the speed of the circuit generated by the logic circuit synthesis tool alone. This method may be widely used because the mapping to a CMOS logic circuit is of general application in electronics.

SUMMARY OF THE INVENTION

The path depth reduction method based on selectors introduced in references 2 and 3 may improve performance in many cases. However, in a practical logic circuit, a plurality of paths may exist between an input terminal and an output terminal which are the starting point and the ending point of the paths. In other words, when a path from the input terminal is traced toward the output terminal, a path may be found that diverges at a gate and separates into two or more paths, and these paths may converge at another gate near the output terminal and rejoin one path to the output terminal (this path divergence and convergence will be referred to as "path looping").

A path looping example is given in FIG. 3. Here, a path from IN1 to O1 diverges at the output N100 from S100 and separates into two paths (N100→I0 of S101 and I1 of S101), and these paths converge at S101 and rejoin one path. This path then diverges at the output N101 from S101 and separates into two paths (N101 I0 of S102 and I1 of S102), and these paths converge at S102 and rejoin one path.

If a critical path has such path looping and separates into a plurality of sub-paths, it is necessary to apply path depth reduction to these two or more sub-paths simultaneously to reduce the path delay. However, the path depth reduction method introduced in references 2 and 3 is effective only for a single path.

Basic path depth reduction patterns described in these references are shown as items b to e in FIG. 1. All of these patterns, in fact, can be used only for a single critical path. If we try to apply the path depth reduction pattern of item b in FIG. 1 to the two path stages formed by the two selectors S101 and S102 in the section from N100 to O1 of the circuit shown in FIG. 3, a circuit is translated as shown in FIG. 5 where the number of stages increased from three stages to four stages. As is evident from the above, the conventional method described in references 2 and 3 is not effective for a looping critical path.

In many cases, a circuit with a looping critical path may be found. A typical case is an arithmetic circuit such as an adder. For example, FIG. 19 shows a carry output C3 circuit portion extracted from a circuit comprising 4-bit ripple-carry adders. In this circuit, the critical path loops in three sections (G10→G11–G12/G16→G13, G13→G17–G18/G21→G22, and G22→G23–G24/G27→G28). An arithmetic circuit such as an adder is essential for an LSI that must execute arithmetic operation, for example, a CPU to execute arithmetic calculation and a DSP chip for signal processing installed in mobile telephone equipment. In terms of practical applications, thus, it is very important to provide a delay reduction method that is also effective for a looping critical path.

In the method of prior art reference 3, described above, the selectors with two inputs and one output, generated after the path depth reduction processing based on selectors, are mapped onto a general CMOS logic circuit consisting of AND/OR gates by a logic circuit synthesis tool. Without considering the delay of the circuit generated after these selectors with two inputs and one output are mapped to CMOS gates, the critical path in the circuit consisting of selectors is presumed, and its depth reduction is performed. In this process, there is a possibility of reducing the number of stages, or the depth of a path, that is not critical. In the prior art reference 3, however, no concrete description is made for how to precisely presume a critical path in the circuit generated after mapping.

It has been shown experimentally that the reference 3 algorithm may output a circuit comprising complex gates that simply substitute for the selectors with two inputs and one output. In the method of reference 3, after the path depth reduction processing based on selectors is performed for the circuit comprising selectors, the reduced selectors are mapped onto a CMOS logic circuit. This may result in a circuit where the number of stages is virtually equal for all paths in the circuit, and no one critical path stands out as the preferred path to be input to the mapping tool. If complex gates that simply substitute for the selectors with two inputs and one output are prepared in a library cell set, a circuit may be generated in which no one critical path stands out because the selectors have simply been translated into the corresponding complex gates. The mapping tool, therefore, does not execute Boolean equation level optimization during the optimization process. The mapping tool tends to output a circuit generated only by simple translation.

Meanwhile, in general CMOS logic circuits, complex gate cells with four or more inputs cause longer delay time. In many cases, higher speed circuits can be generated by circuit configurations excluding these complex cells. In the method of reference 3, however, such complex gate cells of longer delay time are frequently used due to the mapping described above. To achieve a more effective delay reduction, it is necessary to control the mapping program by any means and to make the program use cells other than the complex gates with four or more inputs, so that the program will generate a higher speed logic circuit.

The present invention preferably provides a method of reducing the number of stages, or the depth of a critical path, in a logic circuit that may include a looping critical path. This method preferably includes generating a pass-transistor or CMOS logic circuit that can operate at high speed.

The present invention preferably also provides a method of precisely presuming a critical path in a circuit generated after the mapping of the selectors reduced by the path depth reduction processing based on selectors to the corresponding CMOS logic gates. This method preferably provides high-speed CMOS logic circuits of shorter delay than conventional methods.

The present invention may also provide higher-speed CMOS logic circuits by controlling an existing logic circuit synthesis tool to make the tool avoid using complex gates with four or more inputs, with which a longer delay may occur, when mapping the selectors to the corresponding CMOS logic gates.

The present invention preferably enables the provision of high-speed CMOS logic circuits by using a selector-based delay model.

The present invention includes a logic circuit design method as a preferred embodiment in which a given logic circuit comprising gates is replaced by a corresponding one comprising selectors with two inputs and one output by translating the gates into logically equivalent functional selectors. Furthermore, by calculating the delay and slack of the obtained circuit made of selectors, a critical path is detected. A first node (N1) at which the detected critical path diverges and separates into two or more paths, a second node (N2) at which these paths converge, and a first local circuit (LC1) comprising a plurality of selectors with two inputs and one output (S0, S1, . . . S2) through which the critical path branches are routed from the first node (N1) to the second node (N2) are detected.

The number of stages, or the depth of the critical path, is preferably reduced by replacing the first local circuit (LC1) by a logically equivalent third selector (S3) with two inputs and one output. Where the control input S of the selector S3 is controlled by the first node (N1), the input I0 of the selector S3 is controlled by a second local circuit (LC2) that is formed by inputting a logical value of "0" to the first node (N1) in the first local circuit (LC1), and the input I1 of the selector S3 is controlled by a third local circuit (LC3) that is formed by inputting a logical value of "1" to the first node (N1) in the first local circuit (LC1). By executing the above path depth reduction processing once, or by repeating it two or more times, the number of stages (the depth) of the entire circuit may be reduced.

From the logic circuit comprising the selectors with two inputs and one output, obtained by the above path depth reduction processing, a CMOS logic circuit of improved delay is preferably generated by mapping these selectors to AND and OR CMOS logic gates. When this mapping is executed, the use of complex gates with four or more inputs is selectively inhibited. Consequently, the mapping generates a high-speed CMOS logic circuit of shorter delay time as the intended logic circuits of improved delay. It should be noted here that the term "complex gates" or "complex cells" are cells which combine a plurality of primitive functions (for example, AND or OR functions). These complex gates or complex cells are used instead of a combination of cells that each has a primitive function because a complex gate may have an advantage in seize or power consumption.

Moreover, in at least one preferred embodiment of the present invention, a library is provided for storing the descriptions of the logical functions of the selectors with two inputs and one output so that these selectors used for processing of the invention will be independent of the CMOS technology.

Other features and advantages of the present invention will be apparent from the following description taken in conjunction with the accompanying drawings and attached claims.

BRIEF DESCRIPTION OF THE DRAWINGS

For the present invention to be clearly understood and readily practiced, the present invention will be described in conjunction with the following figures, wherein like reference characters designate the same or similar elements, which figures are incorporated into and constitute a part of the specification, wherein:

FIG. 12 shows exemplary contents of a library to be input to the delay reduction program and mapping program of the delay reduction system of the present invention in FIG. 11;

DETAILED DESCRIPTION OF THE INVENTION

It is to be understood that the figures and descriptions of the present invention have been simplified to illustrate elements that are relevant for a clear understanding of the present invention, while eliminating, for purposes of clarity, other elements that may be well known. Those of ordinary skill in the art will recognize that other elements are desirable and/or required in order to implement the present invention. However, because such elements are well known in the art, and because they do not facilitate a better understanding of the present invention, a discussion of such elements is not provided herein. The detailed description will be provided hereinbelow with reference to the attached drawings.

The delay reduction method for logic circuits according to the present invention will now be explained in detail with reference to the drawings for illustrating some preferred embodiments of the invention.

First Exemplary Embodiment

Using the simple logic circuit shown in FIG. 3 as an example, a first preferred embodiment of the present invention will be explained below. In the circuit shown in FIG. 3, the selectors with two inputs and one output are labeled S100, 3101, and S102. Theses selectors with two inputs and one output have the following logical function: either input I0 or I1 is selected and output to O1, depending on the 0/1 logical value of control input S, as is represented by the Boolean equation E50 described in FIG. 2.

Figure 2:
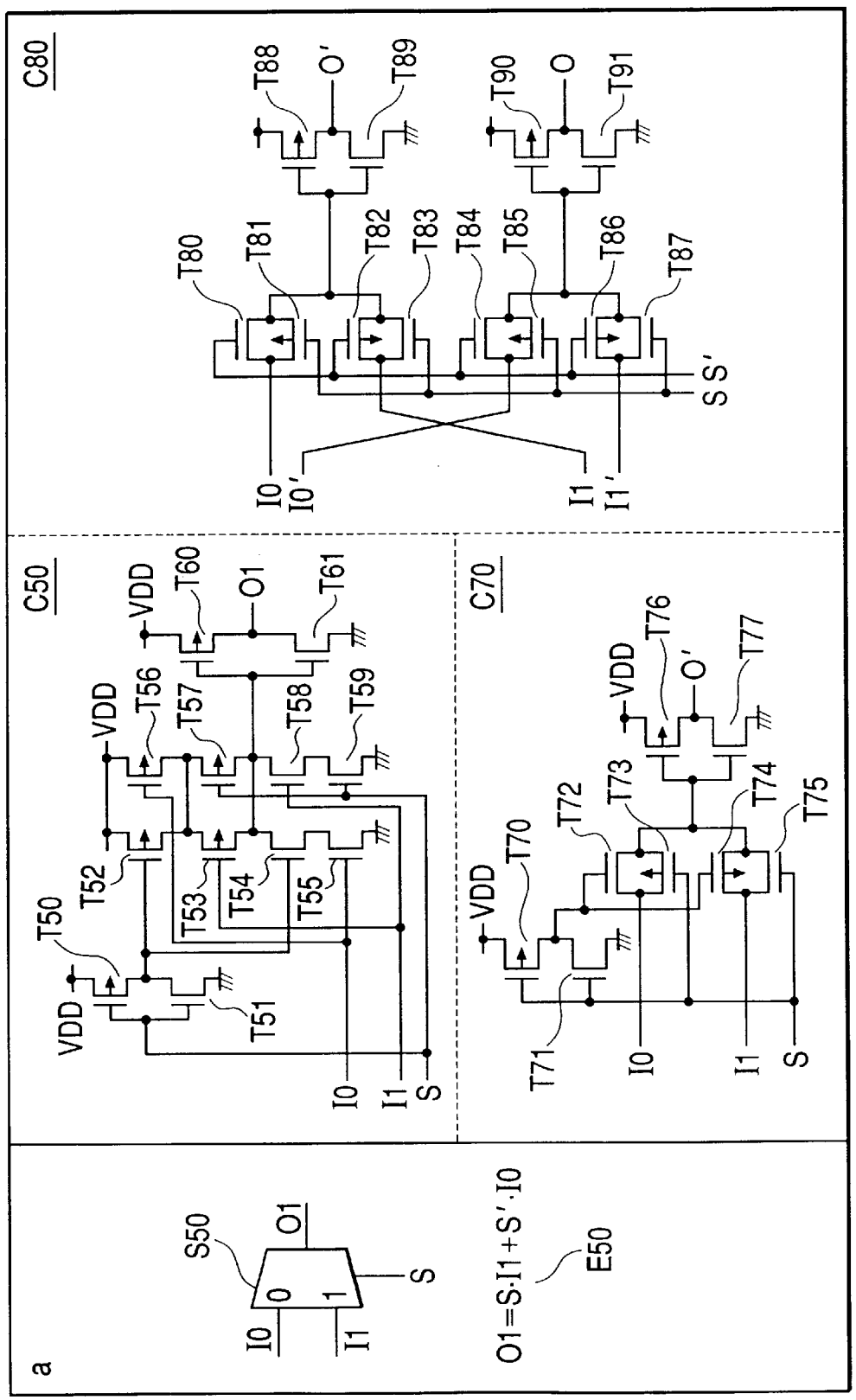
FIG. 2 shows a block diagram of a selector with two inputs and one output for logical function implementation and examples of its CMOS logic circuit configuration and pass-transistor logic circuit configuration.

To implement the selector function, its logic circuit is configured as, for example, C50, C70, and C80 shown in FIG. 2. C50 is an example of a CMOS logic circuit configuration and C70 and C80 are examples of the pass-transistor circuit configuration. C80 is dual-rail logic using signals of both positive and negative polarities. Although there are many other types of circuits in which the selectors with two inputs and one output can be configured, the dual-rail logic circuit of C80 type is used for the selectors for explanation herein with the assumption that the delay per selector stage is approximately 0.3 ns. Because a signal and its inverse polarity signal always exist in the dual-rail logic circuit, an inverter for polarity matching is not necessary. Thus, the delay caused by the inverter for polarity matching can be ignored in this embodiment. It is assumed that all input signals IN1 to IN4 (FIG. 3) are input with a delay time of 0 ns and the assumed delay constraint of the output is 0.6 ns.

Figure 1:
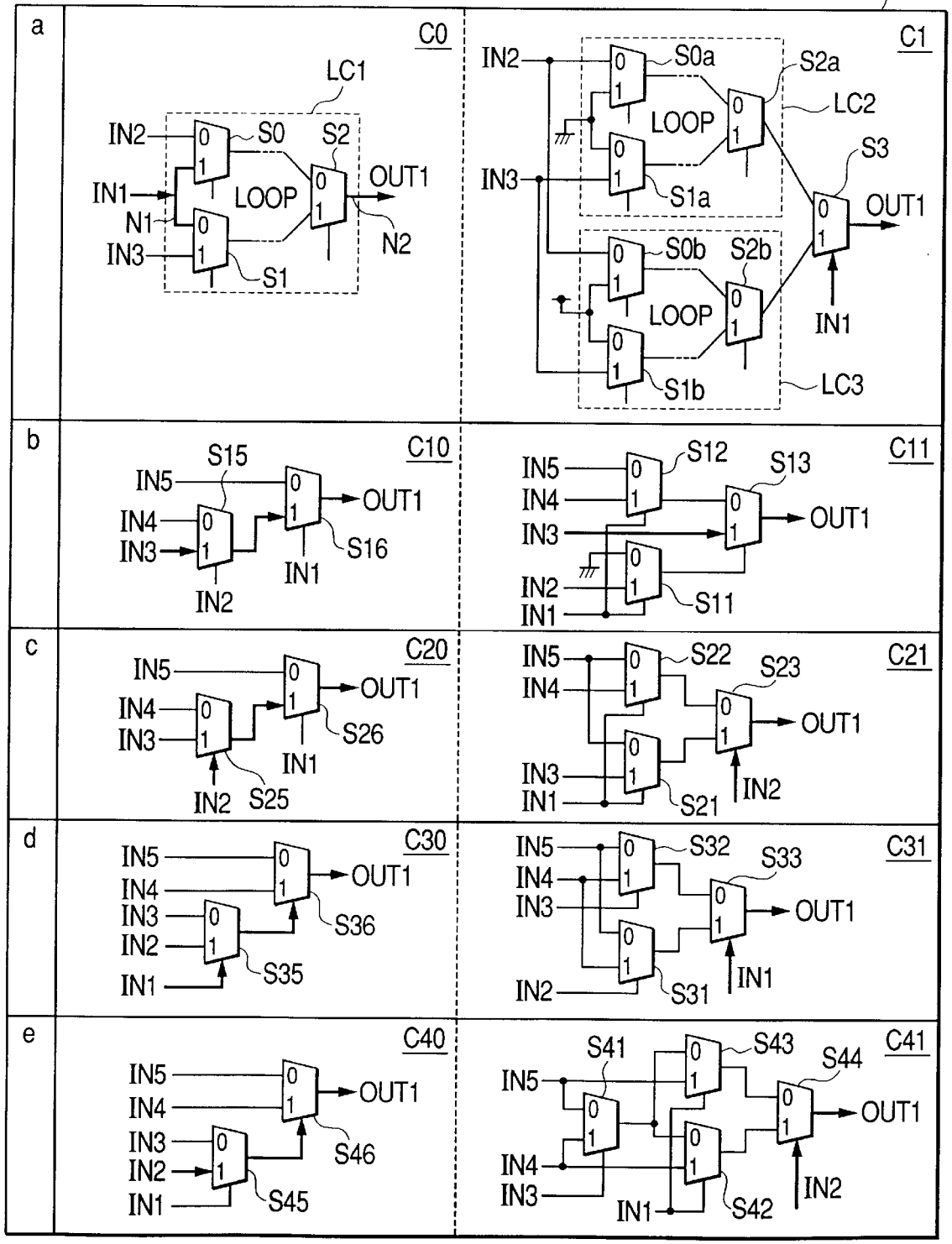
FIG. 1 is a set of diagrams for illustrating a preferred embodiment of the present invention.

Before explaining the delay reduction method according to the present invention, an exemplary limitation of the conventional method will be explained in further detail by using the circuit shown in FIG. 3. In the method of reference 2, first the circuit delay calculation is executed and a critical path is detected. Then, the time allowed until the delay constraint, which is termed "slack," is calculated for each node in the circuit. Furthermore, for each cell, an indicator defined as the minimum slack difference between the input pins of the cell, which is termed "hole," is calculated. Finally, a circuit section showing the greatest hole value in the circuit is detected and a path depth reduction pattern selected from the patterns b to e in FIG. 1 is applied to the circuit section to reduce the number of stages (the depth) of the critical path. Actual application of the method of reference 2 to the circuit shown in FIG. 3 will be described below.

To obtain the slack for each node, calculation is executed for the arrival time of the signals at each node in the circuit and the required time. The arrival time of a signal represents how long the signal is delayed from the input time to when the signal has arrived at the node (the "delay time"). At, for example, N100, a signal of delay time of 0 ns is input to both inputs IN1 and IN2 of S100, therefore, the arrival time of the signal is as follows:

0 ns+delay time of 0.3 ns in the S100=0.3 ns

The "required time" is a delay limit at the node; the signal is required not to exceed this limit in order to satisfy the delay constraint set for the output O1. Using, for example, N101: the signal must be output to the output O1 from S102 with a delay of 0.6 ns (assumed above), and therefore, the required time of N101 is as follows:

0.6 ns–delay time of 0.3 ns in S102=0.3 ns.

Lastly, from the thus obtained arrival time and required time, the slack defined for all nodes in the circuit is calculated as follows:

Slack=required time−arrival time

Figure 4:
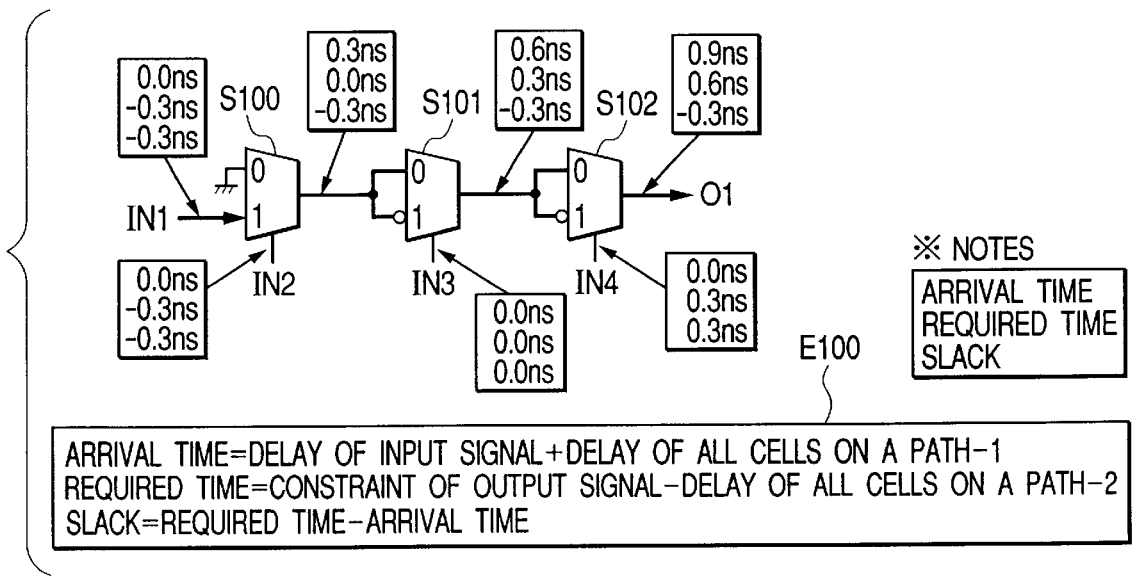
FIG. 4 shows the equations and sample results of arrival time, required time and slack calculations for the circuit in FIG. 3.

FIG. 4 presents the results of the above calculation of the arrival time and required time for each node. As evident from the equation of slack definition, if the slack becomes negative, it indicates that the actual signal arrival occurs behind the required time. That is, the circuit performance does not meet the required speed, or in other words, the signal delay throughout the circuit exceeds the delay constraint. If the slack is positive, it indicates that the signal arrives at the node early enough to meet the required speed, and additional time is available before the delay constraint is violated. In this way, the slack is the indicator of how early the signal actually arrives at the node compared to the required time, i.e., by how long was the delay constraint satisfied or by how long was the signal delayed in excess of the delay constraint. Thus, a critical path is a path of the least slack, or in other words, the least time allowed before violating the delay constraint. In the circuit in question, a path through three stages of selectors IN1/IN2→S100→S101→S 102→O1 is a critical path, as evident from FIG. 4.

Thereafter, the holes of the cells are obtained. From FIG. 4, the holes of the cells are:

S100: 0 ns (slack of input S: −0.3 ns, input I1: −0.3 ns)

S101: 0 ns (slack of input S: 0.0 ns, input I0: −0.3 ns, I1: −0.3 ns)

S102: 0 ns (slack of input S: 0.3 ns, input I0: −0.3 ns, I1: −0.3 ns)

The holes of all cells are 0.

As described above, in the method of reference 2, a circuit section showing the hole greater than 0 is detected and a path depth reduction pattern selected from the typical patterns b to e in FIG. 1 is applied to reduce the depth of the critical path. Therefore, the path depth reduction processing is not executed for the circuit in question. This is because a hole value defined as the least slack difference is construed as the quantity indicating how well the circuit is optimized in the method of reference 2. Therefore a circuit in which no hole values are observed is regarded as one in which the time allowed for delay until the path delay constraint is equal throughout the circuit and path depth reduction processing is not necessary.

Figure 3:
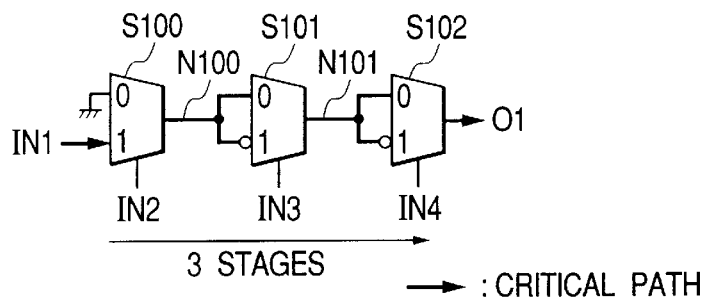
FIG. 3 is a circuit example for which path depth reduction is not optimized by use of the conventional method.

However, this determination is not correct for the circuit example shown in FIG. 3 where the critical path divergence and convergence are found. The reason is as follows. For a looping critical path, at least two paths having the same worst slack value exist, separated from it. At the cell where these paths converge, two out of the three paths connected to the three inputs of the selector have the same slack value and join the looping critical path, giving a hole value of 0. Even if some delay margin exists in the remaining (one) path; this is not reflected in the hole value. In fact, the slacks in the circuit shown in FIG. 3 are:

IN3→S101→S102→O1 two stages, slack: 0 ns

IN4→S102→O1 one stage, slack: 0.6 ns

The number of stages per path and the time allowed for delay per path are not equal throughout the circuit. For a looping critical path, the fact that no hole values are observed does not always indicate that the number of stages per path is equal and a critical path that "stands out" does not exist in the circuit.

Additionally, because the circuit example shown in FIG. 3 is small, it is seen that the number of stages of the critical path can be reduced and delay time reduction is possible without regard to the hole indicator if it is possible to reduce the stages of paths from N100 to O1 to one stage in the circuit section comprising S101 and S102.

Figure 5:
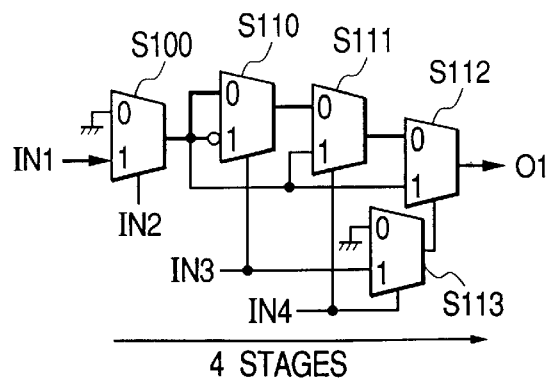
FIG. 5 shows a resulting circuit by the application of the conventional path depth reduction method shown as item b in FIG. 1 to the circuit in FIG. 3.

It should be noted that the number of stages with two or more paths must be reduced at the same time if the critical path loops as in this example. However, reducing two stages to one stage is possible for only one path by any of the path depth reduction patterns b to e in FIG. 1 as disclosed in the reference 2. It is thus impossible by the method of reference 2 to reduce the number of stages of a critical path of loop structure; i.e., the path diverges at a node and separates into two or more paths which eventually converge again. Practically, if the path depth reduction pattern b in FIG. 1 is applied to the loop path, the resulting circuit is as shown in FIG. 5 where the number of stages increases to four and the delay increases.

If a loop exists in the critical path, it is effectively impossible to reduce the delay in the circuit by the method introduced in reference 2 as described above. This problem cannot be solved by modifying the hole definition. This problem is the fundamental problem of the path depth reduction processing based on selectors. The same problem occurs when using the method of reference 3 that uses the same path depth reduction processing based on selectors.

The path depth reduction method based on the present invention is presented as item a in FIG. 1, in order to address the above problems and enable a reduction in the number of stages in any kind of logic circuit. In the path depth reduction method presented as item a in FIG. 1, a divergence node N1 at which the critical path separates into two or more sub-paths and a convergence node N2 at which these sub-paths converge are found. Furthermore, a local circuit LC1 comprising a plurality of selectors (S0, S1 ... S2) through which the paths separated from the critical path are routed from the node N1 to the node N2 is detected. Thereafter, a selector S3 is created that is equipped with the control input S to which the divergence node N1 is connected, the input I0 to which a local circuit LC2 formed by inputting a logical value of "0" to the node N1 in the local circuit LC1 is connected, and the input I1 to which a local circuit LC3 formed by inputting a logical value of "1" to the node N1 in the local circuit LC1 is connected. The thus created selector circuit has the circuit structure in accordance with the well-known Shannon expansion of logic functions:

$f(x, \ldots) = f(x=0, \ldots)*x'' + f(x=1, \ldots)*x$ where $x''$ denotes a signal of inversion of x.

In this example, "f( )" corresponds to the logic function of the local circuit LC1 and "x" corresponds to the divergence node N1. Therefore, it is ensured that the same logical function circuit as the original logic circuit is created after such circuit transformation.

As shown in C1 of item a in FIG. 1, this circuit transformation also ensures that the number of stages of paths of loop structure can be reduced to one stage, which is impossible through the use of the conventional methods. By the application of this method to the circuit example shown in FIG. 3 for which the path depth reduction is impossible by the conventional method, a circuit is actually formed as is shown in C120 in FIG. 6 where the number of stages is one fewer than that of the circuit in FIG. 3.

Figure 6:
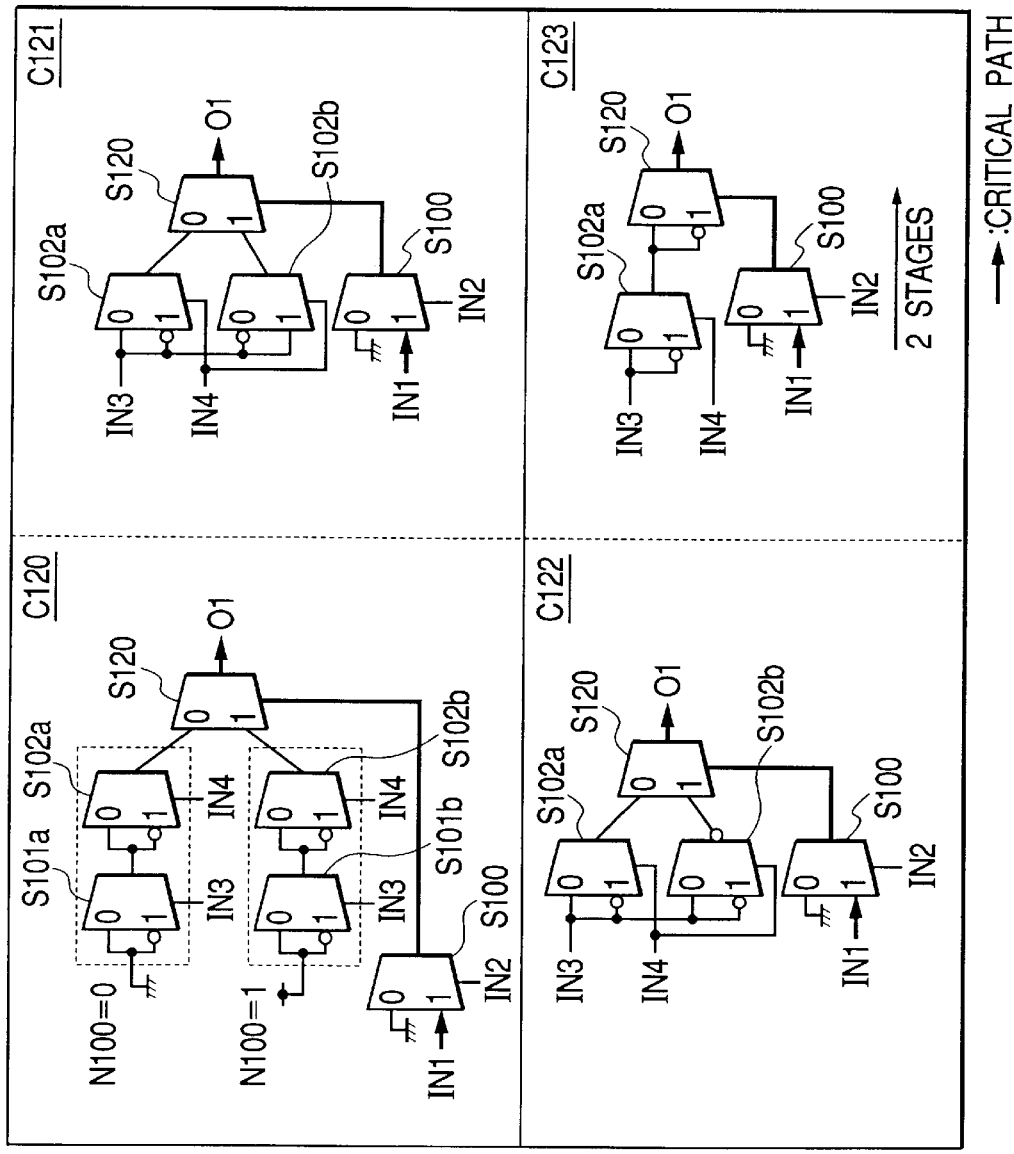
FIG. 6 is a set of diagrams showing resulting circuits by the application of the path depth reduction method of the present invention shown as item a in FIG. 1 to the circuit in FIG. 3.
Figure 8:
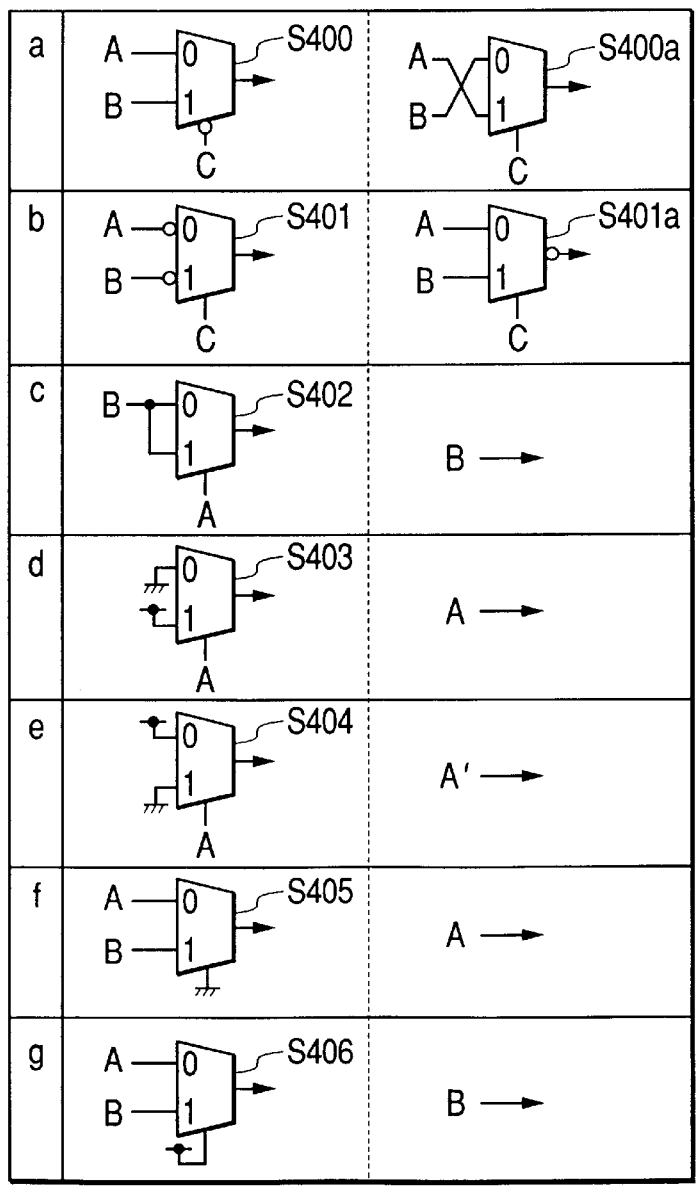
FIG. 8 shows redundant selectors.

A selector S102a in the circuit C120 corresponds to a selector presented as a redundant selector pattern d in FIG. 8 and a selector S102b in the same circuit corresponds to a selector presented as pattern e in FIG. 8. Thus, these selectors can be simplified and the circuit C120 is transformed into a circuit C121 as shown in FIG. 6. Furthermore, this circuit C121 is transformed into a circuit C122 by executing a polarity adjusting routine which is presented as item b in FIG. 8. Finally, the circuit C122 is transformed into a circuit C123 by combining the selectors S102a and S102b into a selector S102a, which is possible because the polarity of these selectors is opposite to each other. By the path depth reduction processing based on the present invention, illustrated as item a in FIG. 1, the number of stages can be reduced from three to two stages and the delay can be reduced from 0.9 ns to 0.6 ns in the circuit shown in FIG. 3 without an increase in the number of selectors as described above.

Figure 7:
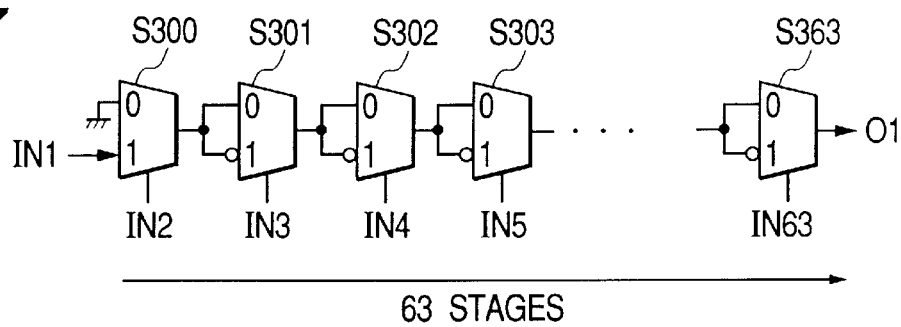
FIG. 7 is a circuit example for which path depth reduction is not optimized using the conventional method.

Because the circuit example in FIG. 3 explained above is relatively small, a significant disadvantage is not revealed by the use of the conventional method. However, it is significant that the conventional method is not effective for a larger circuit. For example, the circuit shown in FIG. 7 is an extreme case in which the critical path loops in 63 stages. Path depth reduction cannot effectively be performed by the conventional method, and the circuit continues to have a delay time of approximately 19.2 ns in 63 stages. In contrast, through the use of the method of the present invention for the same circuit, the number of stages may be reduced to six stages and the circuit can be reformed into a circuit of as short a delay as 1.8 ns. Although this example details an extreme case, the delay reduction method of the present invention enables delay reduction for circuits with a looping critical path which aren't addressed by conventional methods.

Second Exemplary Embodiment

Figure 9:
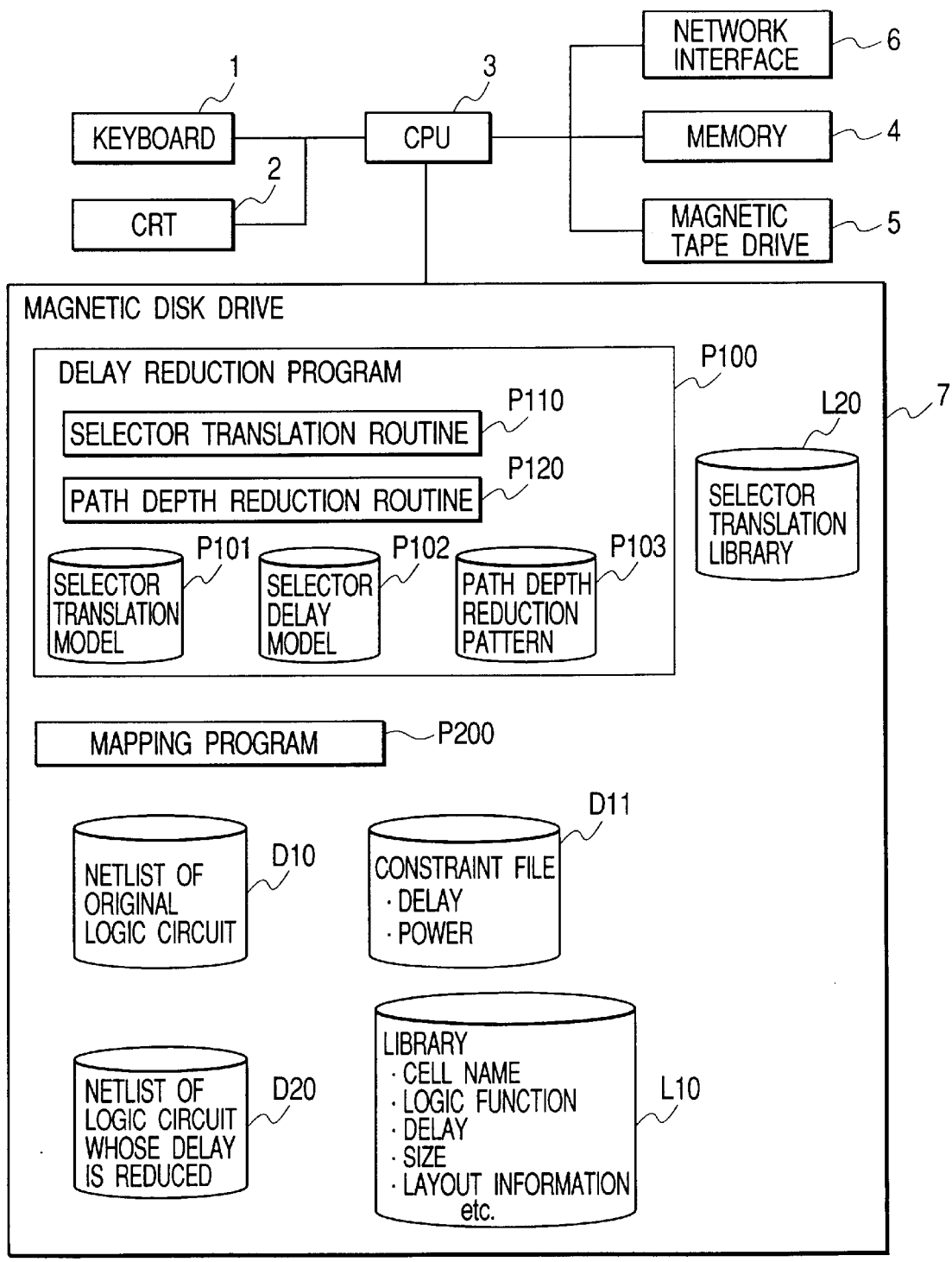
FIG. 9 shows the outline of a delay reduction program according to one embodiment of the present invention.

In the embodiments described above, the delay reduction method based on the present invention was explained using a simple logic circuit as an example. As a preferred additional embodiment of the invention, a case where a computer system as shown in FIG. 9 performs delay reduction for a more complex logic circuit will be discussed below. Unlike above, in this example all circuits are eventually configured as more general CMOS logic circuits consisting of AND and OR gates, where selector circuits comprising pass transistors are not used at all.

(1) Overall System Structure

FIG. 9 shows the outline structure of a delay reduction system using selectors to implement the present invention and a computer system for running this system. This computer system comprises an input device, for example, a keyboard 1, a display (CRT) 2, a central processing unit (CPU) 3, a memory 4, a magnetic tape drive 5, a network interface 6, and a magnetic disk drive 7 on which a delay reduction program P100 is stored. The program P100 comprises a selector translation routine P110, a path depth reduction routine P120, selector translation models P101, selector delay models P102, and path depth reduction patterns P103.

The magnetic disk drive 7 may also store a mapping program P200, a netlist of original logic circuit D10, a selector translation library L20 to store the descriptions of selector logical functions of selector nets that the program P100 outputs, a library L10, dand/or a constraint file D11 to store the descriptions of delay constraint conditions.

By being commanded by the circuit designer via the keyboard 1, the programs P100 and P200 are loaded from the magnetic disk drive 7 and stored in memory 4 and executed under the control of the CPU 3. The progress of the program is displayed on the CRT 2 as required. A netlist of a logic circuit for which delay improvement has been completed is generated and delivered to an automatic layout program P300 which is included in a flowchart of FIG. 10 via the magnetic tape drive 5 or the network interface 6.

Figure 10:
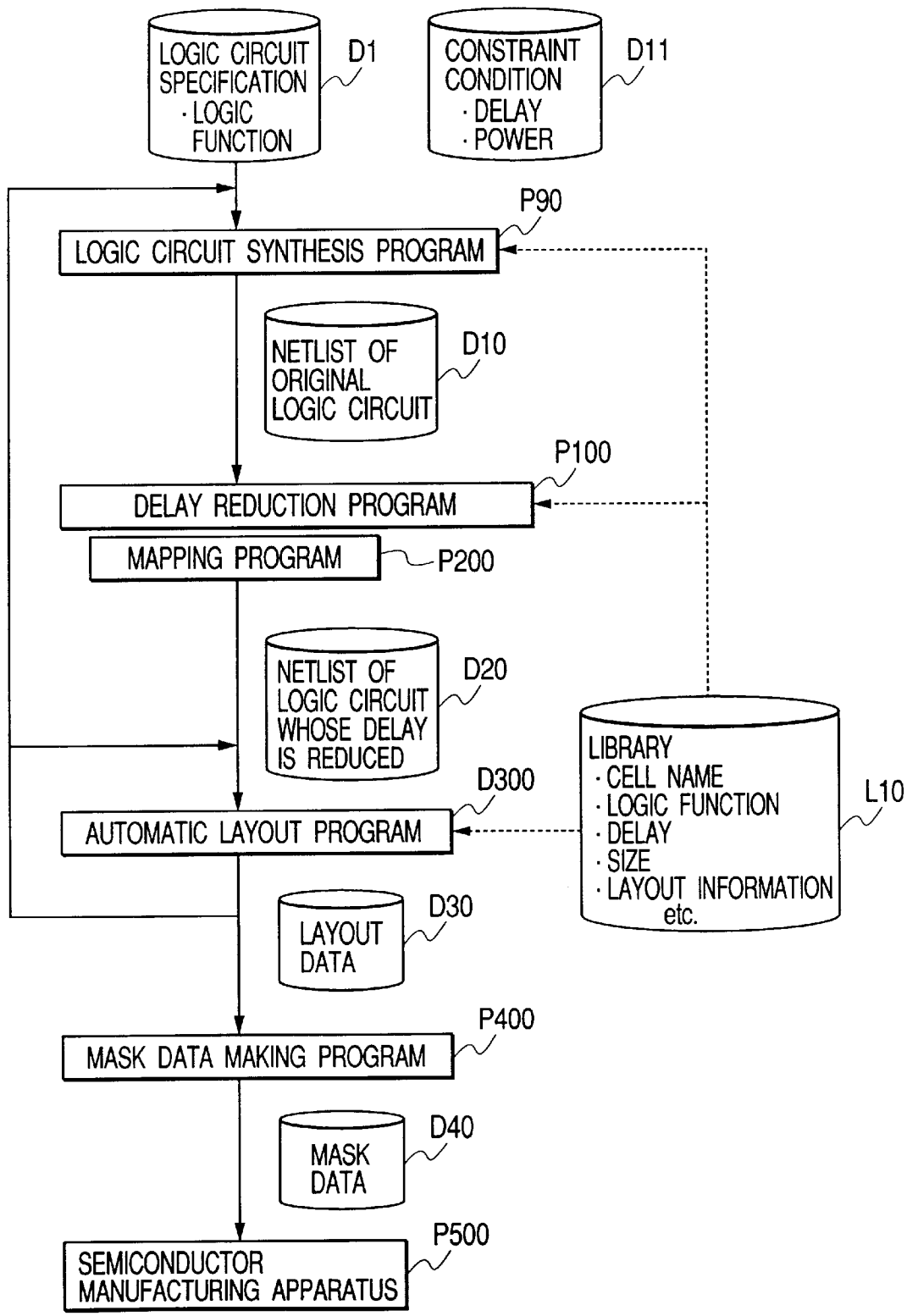
FIG. 10 is a flowchart illustrating a process of generating a logic circuit by the delay reduction program of the present invention up to manufacturing a semiconductor integrated circuit of the logic circuit, based on the logic circuit specifications.

In the flowchart of FIG. 10, the circuit designer inputs logic circuit specifications D1 and constraint conditions D11 to the files thereof. The information to be stored in these two files preferably includes the description of the logical function of the target logic circuit in terms of logic functions and a delay constraint for the output signal from the logic circuit, which describes how long the input signal to the logic circuit is delayed as it passes through the circuit. A logic circuited synthesis program P90 generates a logic circuit D10 from the logic circuit specification D1 file, while referring to a library L10.

The logic circuit D10 is preferably stored as a description of the generated circuit in text form called a netlist in which cell names and cell-to-cell wiring connect ions are described. There are various kinds of netlist formats, for example, Verilog and EDIF; examples of netlists are given as D10, D15, and D20 in FIG. 32.

In the library L10, for example, these descriptions are stored as cell names, names of cell input/output pins, logical function, delay, size (area), and transistor circuit wiring as listed in the table in FIG. 12. From the information described in the logic circuit D10 netlist and by referring to the library L10, the delay reduction program P100 and the mapping program P200, which are part of this exemplary embodiment, output a logic circuit D20 for which delay improvement has been completed with the same logical function as the logic circuit D10 so that the set delay constraint D11 for the circuit will be satisfied.

By referring to the library L10, the automatic layout program P300 determines an optimum layout of the logic circuit D20 and creates layout data D30. According to the layout data D30, a mask data making program 400 determines a plurality of mask patterns for producing the logic circuit D20 by using a semiconduct or integrated circuit technique and generates mask data D40 that represents these mask patterns. A semiconductor manufacturing apparatus P500 manufactures the semiconductor integrated circuit having the intended logical function by using the mask data D40.

The above programs P90, P100, P200, P300, and P400 can be run on the same computer or may be distributed and run on different computers interconnected via a local area network. Alternatively, these programs can be run on computers directly connected to the Internet from various locations, or even from different countries. As the logic circuit synthesis program P90, mapping program P200, automatic layout program P300, and mask data making program P400, the existing tools implementing the corresponding functions can be used. A tool that functions as the logic circuit synthesis program P90 and mapping program P200 may also be available.

Initially in this example, necessary input data for the target logic circuit is supplied to the delay reduction program. The delay reduction program replaces this logic circuit with a logically equivalent circuit comprised entirely of selectors and detects a critical path. The program detects a loop of the detected critical path; the path separates into a plurality of branch paths which eventually converge and join one path in the loop. The program replaces a local circuit formed by the detected loop with the logic circuit configuration offered by the present invention, which was explained in earlier embodiments, and reduces the number of stages of the critical path to reduce the delay throughout the circuit. If the critical path does not include a loop structure, the program preferably uses any of the path depth reduction patterns b to e in FIG. 1, which were introduced with respect to references 2 and 3.

Figure 17:
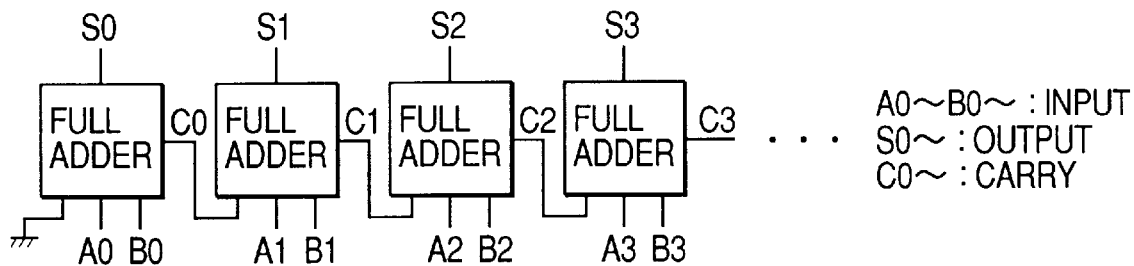
FIG. 17 shows the configuration of ripple-carry adders.
Figure 18:
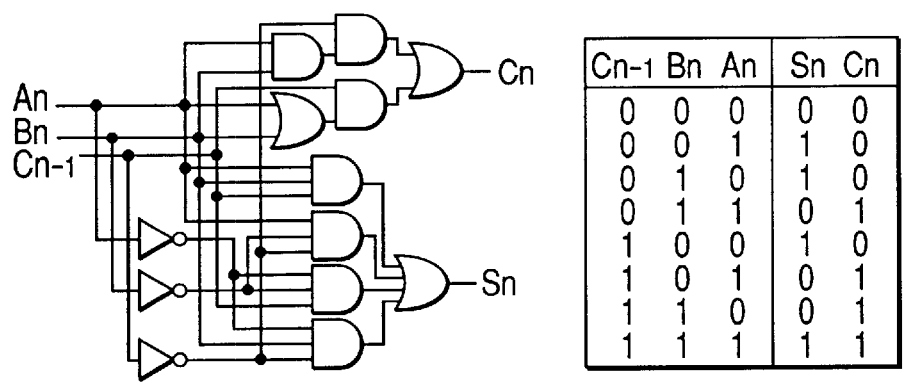
FIG. 18 is an example of full adder circuitry.
Figure 19:
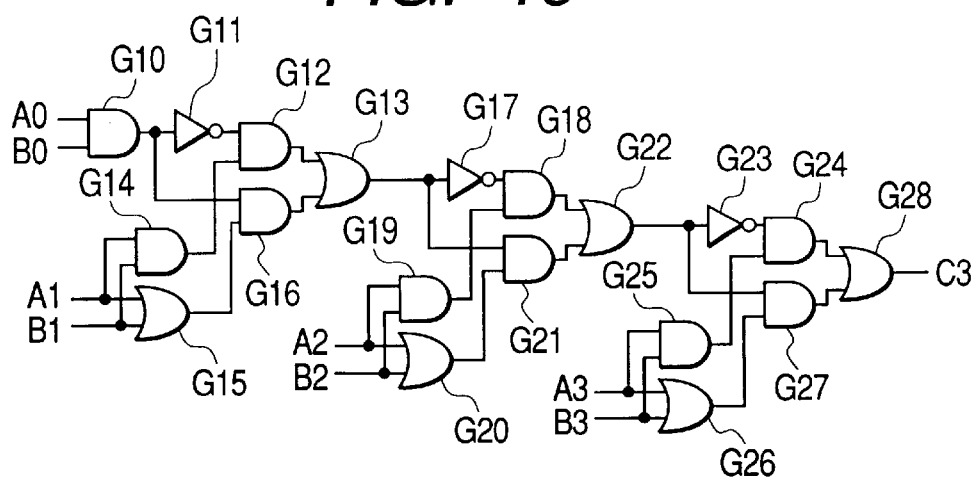
FIG. 19 is a logic circuit example to be input to the delay reduction system of the present invention in FIG. 11.

Using the logic circuit shown in FIG. 19 as an example, the steps of the delay reduction program of this embodiment will be explained below in turn. In the logic circuit shown in FIG. 19, it is assumed that the delay of input signals A0 to B3 is 0 ns (no delay), and the constraint of output signal C3 is 0 ns, that is, the signal must be output with as short a delay as possible. The circuit shown in FIG. 19 is generated by extracting the carry output C3 related circuit portion from the circuit configuration comprising full adders in FIG. 18. The full adders are 4-bit adders of ripple-carry architecture as are shown in FIG. 17.

(2) Selector Translation Routine P110

Figure 13:
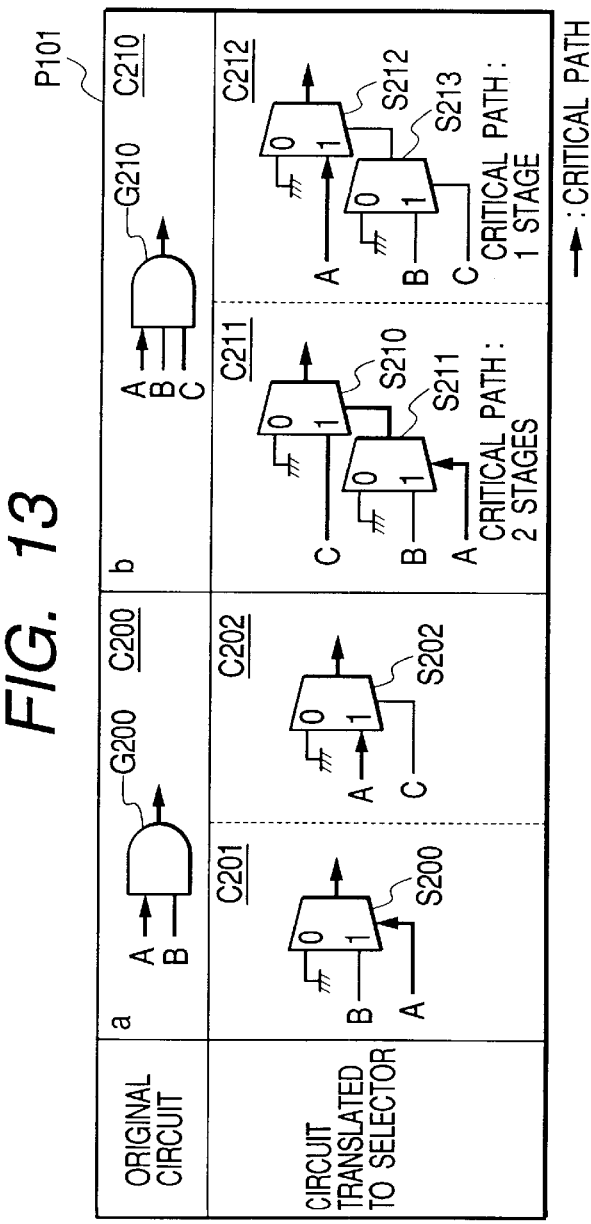
FIG. 13 shows rules for translating original circuits to selector circuits to be used in the delay reduction program of the delay reduction system of the present invention in FIG. 11.
Figures 15, 16:
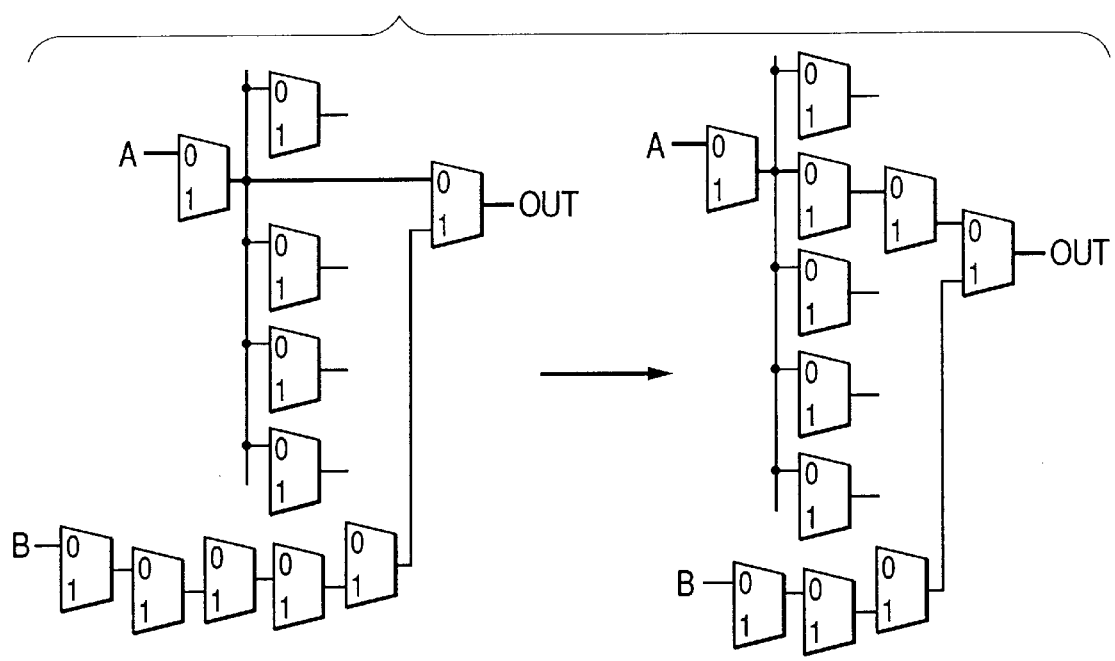
FIG. 15 shows resulting circuit diagrams in a case where an incorrect path is detected as the critical path and path depth reduction processing is executed for the path.
FIG. 16 shows selector logic circuits and corresponding CMOS logic circuits with the same logical function.

The selector translation routine generates a logic circuit comprised entirely of selectors with two inputs and one output and has exactly the same logical function as the logic circuit D10, based on one of the translation patterns which are shown in FIG. 16 and one of the selector translation models P101 which are shown in FIG. 13.

Before transforming the original circuit into a selector circuit, the routine executes the slack calculation process P111 and thereby obtains slack information for the input pins of the cells in the original logic circuit which is required when translating the cells into selectors. Slack is obtained by calculating delay per cell, based on the information from the logic circuit netlist D10, delay constraint file D11, and library L10. Specifically, the delay per cell stage is obtained from the library L10: e.g., 2AND: 0.3 ns 2OR: 0.3 ns INV: 0.1 ns from the table of the library L10 in FIG. 12. In fact, the cell delay varies depending on whether the load put on the cell is heavy or light. To simplify this explanation, the above delay values are assumed to be constant, independent of the load.

Figure 20:
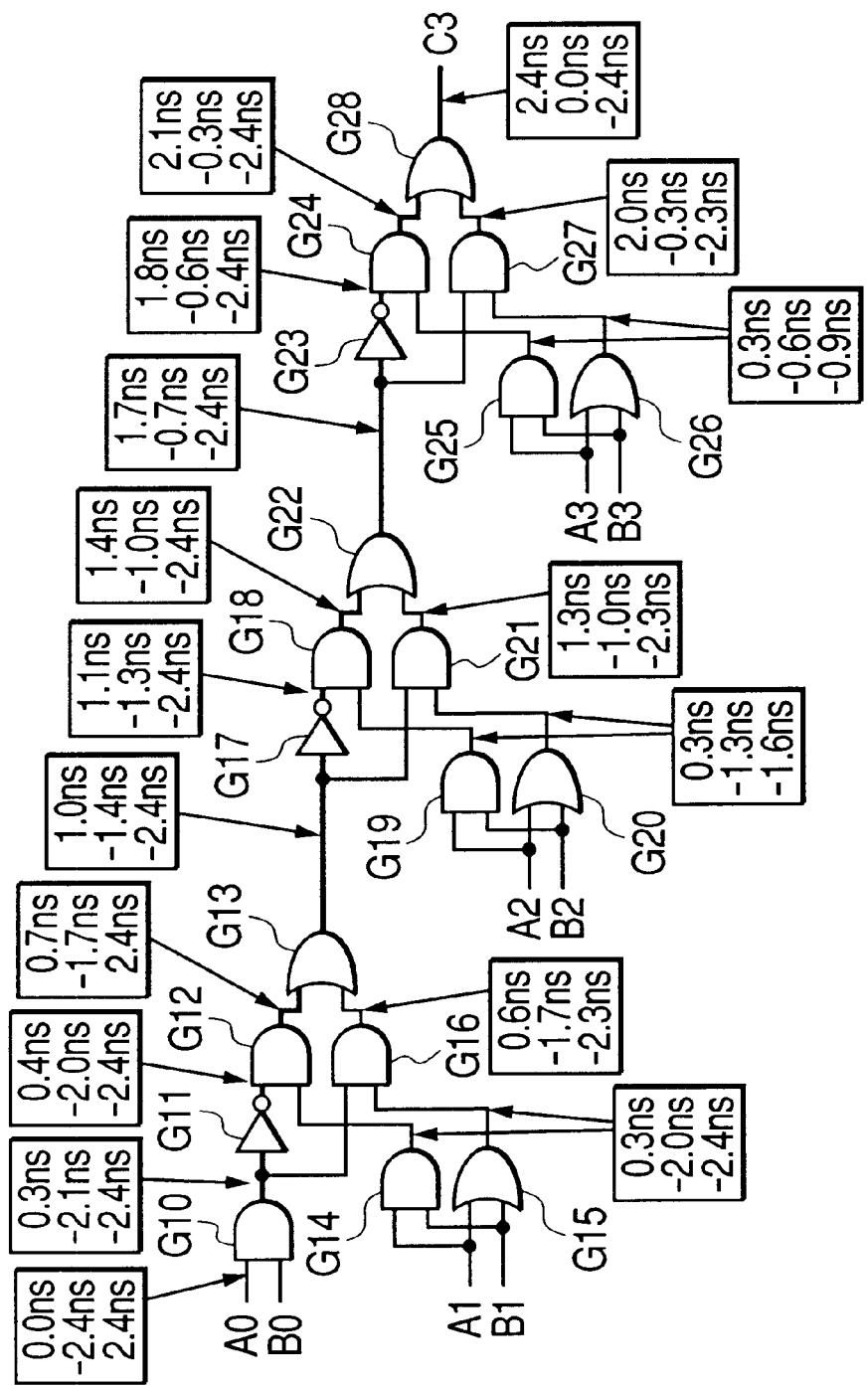
FIG. 20 shows the results of arrival time, required time, and slack calculations for the logic circuit in FIG. 11.

Thereafter, the routine calculates the signal arrival time and required time, according to the same procedure as the method introduced above and obtains the slack of each cell, the result of which is presented in FIG. 20.

Next, the routine executes a translating to selector process P112, based on the slack per cell obtained through the process P111, thereby transforming the original logic circuit into a logic circuit consisting entirely of selectors with two inputs and one output.

Translation pattern a in FIG. 16 is applicable to AND gates with two inputs, such as G10, G12, and G14, in the logic circuit shown in FIG. 19. Translation pattern d in FIG. 16 is applicable to OR gates with two inputs, such as G13 and G15.

Although the procedure up to this point has been the same as in the method introduced with respect to references 2 and 3, the slack information about the original logic circuit obtained through the above process P111 is also used in the present example. In the circuit shown in FIG. 20, take notice of, for example, G13. The slack values of its two input pins are:

Slack of the input pin connected to G12: −2.4 ns

Slack of the input pin connected to G16: −2.3 ns

If the slack values of the two input pins are different as above, the input pin connected to G12, which is the smaller slack value, is assigned to the input I1 of the corresponding selector generated by translation and the input pins connected to G11, which is the better slack, is assigned to the control input S. Specifically, if a translation model C200 in column a in FIG. 13 is applicable to a cell, the cell is translated into a selector model C202 rather than C201.

After a selector with two inputs and one output is mapped to a CMOS logic circuit, as is shown as item e in FIG. 16, one inverter stage is preferably added to the control input S of the CMOS circuit. This inverter makes the delay of such circuit longer than the delay based on the inputs I0 and I1 alone. When the path of lowest slack value is connected to the control input S during the translating to selector process, there is a risk of generating a longer delay circuit including the inverter stage delay if the local circuit of that path is not modified at all and passed to the mapping routine. Therefore, the slack path with a greater delay margin must be connected to the control input S.

For the same reason, if an AND, OR, NAND, or NOR gate with three inputs or more exists, which, however, does not exist in the circuit in FIG. 19, it is preferably translated into a circuit which comprises a plurality of selectors with the input pin of the lowest slack value assigned to the selector stage nearest to the output. Specifically, if a translation model C210 in column b in FIG. 13 is applicable to a circuit cell before being translated into a selector circuit, that cell is translated into a selector model C212 rather than C211.

By translating the original circuit cells to selectors, taking the slack values of the cells into consideration, it is expected that mapping in the later process generates a higher-speed CMOS logic circuit with little slack difference between the paths.

Figure 21:
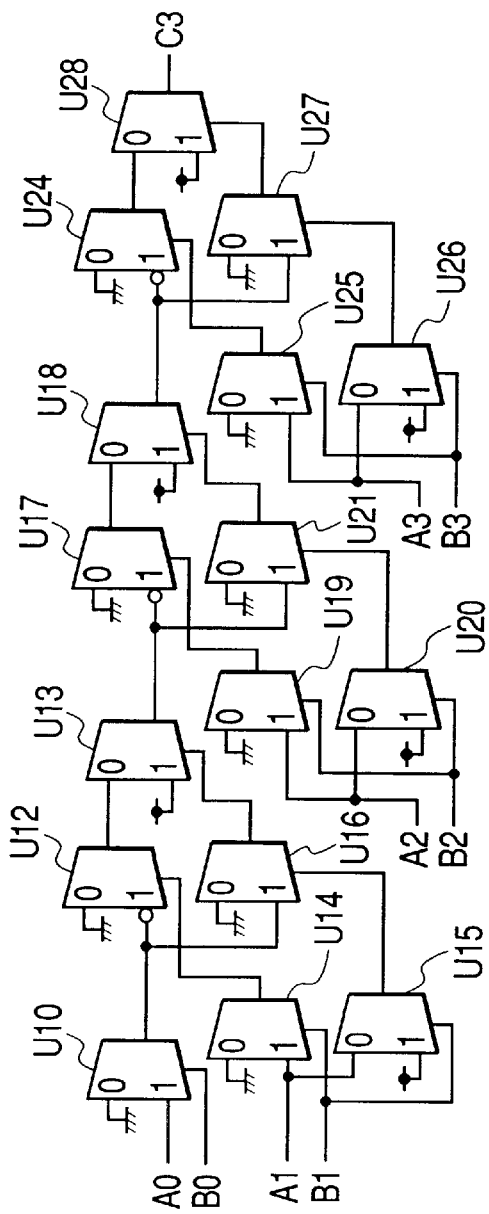
FIG. 21 is a diagram of an intermediate circuit to be generated by the selector translation routine of the delay reduction program of the delay reduction system of the present invention in FIG. 11.

The above translation procedure transforms the original circuit into a selectors-based logic circuit which is shown in FIG. 21. The inverters G11, G17, and G23 in the original circuit in FIG. 19 are represented by a signal inversion symbol (for example, see the input I1 pin of U12) in FIG. 21.

(3) Path Depth Reduction Routine P120

The path depth reduction routine P120 preferably reduces the number of stages of the logic circuit generated by the above selector translation routine P110, described under section (2), according to the path depth reduction method (pattern a in FIG. 1) offered by the present invention, which was explained above. In addition, the path depth reduction method introduced in references 2 and 3 (patterns b to e in FIG. 1) may be used as applicable.

The routine executes its process P121; i.e., delay calculation, slack calculation, and critical path detection for the logic circuit comprising the selectors. As described at the beginning of the present embodiment, the mapping program P200 eventually maps the selectors to AND/OR gates in a CMOS logic circuit configuration. Thus, the selectors were used only for logic circuit path depth reduction processing in the first exemplary embodiment, and it is not necessarily required that the selector cell entities exist in the library L10.

However, for critical path detection processing P111, it is desirable that a critical path can reappear in the CMOS logic circuit generated after mapping that has been performed more closely. For this reason, even if the selector cells exist in the library L10, executing delay calculation by using the delay information for the selector cells is utterly meaningless.

Figure 14:
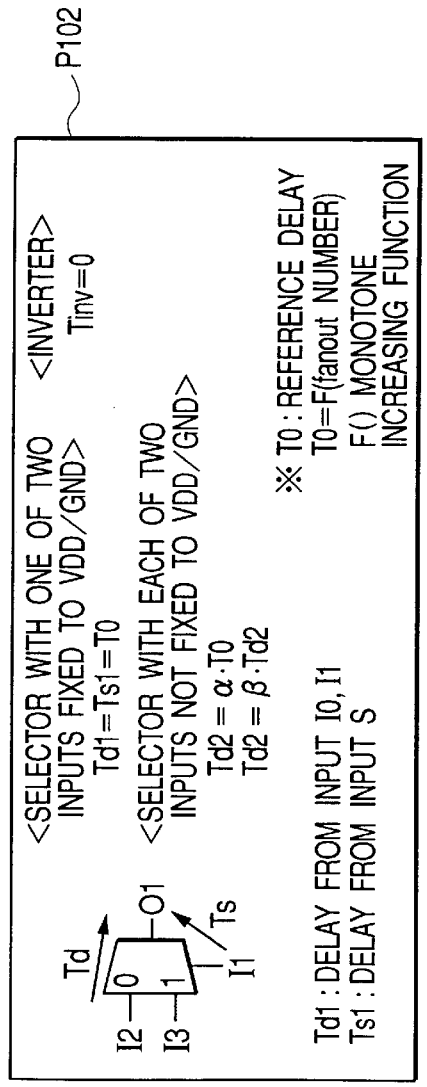
FIG. 14 shows a selector-based delay model to be used in the delay reduction program of the present invention in FIG. 11.

To accomplish the purpose of the critical path detection processing, the path depth reduction routine calculates delay per selector stage according to a delay model which is presented in FIG. 14, which is different from the method of references 2 and 3. This delay model preferably increases or decreases the delay per selector stage according to the fanout number that depends on whether the load put on the selector stage is heavy or light. By using such a model, a path that is critical due to a number of fanouts (i.e., a heavy load), despite a small number of stages of the path, can more accurately be detected as a critical path in the path depth reduction processing based on selectors. An example of such a path is shown in FIG. 15. This model can prevent meaningless path depth reduction.

Furthermore, the delay of a selector with both inputs I0 and I1 not fixed to VDD/GND is set at a greater value than the delay of a selector with one of two inputs fixed to VDD/GND. The reason for this is as follows. By taking a close view of the circuit generated after mapping the selectors to CMOS gates, we find that the selector with both inputs not fixed to VDD/GND is mapped to a combination circuit of an inverter and a complex gate cell 22AND_OR, which is shown as, for example, item e in FIG. 16. This circuit has a delay of 0.1 ns+0.5 ns=0.6 ns. On the other hand, the selector with one of two inputs fixed to VDD/GND, whose examples are shown as items a to d in FIG. 16, even in the worst case, is mapped to a combination circuit of an inverter and a NAND/NOR gate. This circuit has a delay of 0.1 ns+0.2 ns=0.3 ns.

As evident from the above, there is a significant difference between the delay of the selector with both inputs not fixed to VDD/GND and the delay of the selector with one of two inputs fixed to VDD/GND after mapping; in fact, the former is twice the latter. Therefore, if one estimate of delay is applied to these two types of selectors, an incorrect detection of a critical path that is not the most critical in the circuit generated after mapping may occur in a worst case, which may result in meaningless path depth reduction.

For the selector with both inputs not fixed to VDD/GND, moreover, the delay of the signal from the control input S is estimated to be greater than the delay of the signal from the I0 and I1 inputs. This is because it is probable that such a selector is mapped to the circuit example shown as item e in FIG. 16, as described above, and the delay of the signal from the control input S should be estimated to include the delay of one stage of inverter.

Figure 22:
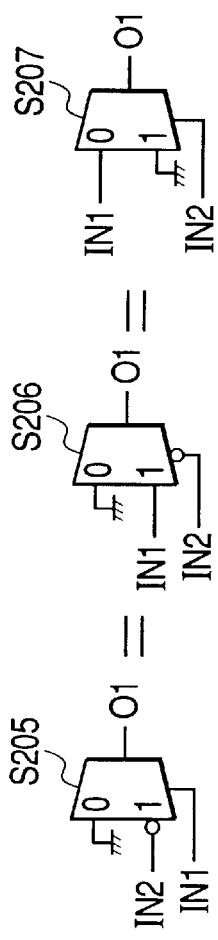
FIG. 22 shows selector circuits with the same logical function.

In many cases, inverters in a selectors-based logic circuit can be ignored. For example, the above-mentioned U12 cell in FIG. 21 corresponds to the S205 cell in FIG. 22, and the S205 cell is the same as the S206 cell where IN1 and IN2 have been swapped. Furthermore, because this S206 cell corresponds to a simplified selector net pattern a shown in FIG. 8, it can be replaced by a selector cell S207 where the inverter is not necessary, as shown in FIG. 22. That is, in the logic circuit in FIG. 21, the input signal to the I1 input of the U12 cell must be inverted, but the inverter itself is not necessarily required.

As seen from items b and c in FIG. 16, in some cases, after a selector-based logic circuit without an inverter is mapped to a CMOS logic circuit, an inverter for polarity adjustment is required in the CMOS circuit. However, there is a possibility that such an inverter used only for polarity adjustment may be removed by the inverter polarity adjustment processing in the mapping program. This processing preferably removes an inverter in combination with the preceding or following inverter if the removal of two successive inverters does not change the circuit logic. Therefore, in the path depth reduction processing based on selectors, a consideration of inverter delay is meaningless in most cases. For the reasons described above, the delay model in FIG. 14 does not take the inverter delay into consideration.

Actually, parameters α and β of the delay model in FIG. 14 are set in the following range:

α=1.0 to 3.0

β=1.0 to 3.0

This relatively wide range for setting parameters α and β is due to the fact that the relative delay per cell usually varies to this same extent according to the library. Reference delay T0 is usually set at the delay of a typical cell existing in the library L10. In the second exemplary embodiment, if the reference delay is assumed to be the delay of 0.3 ns of the 2AND cell in the library L10 shown in FIG. 12, α=1.33, and β=1.25, the following are given:

Ts1=Td1=0.3 ns

Td2=0.4 ns

Ts2=0.5 ns

These delay values are assigned to a selector with one fanout. If delay per fanout is 0.1 ns when calculating additional delay by the number of fanouts, for a selector with two fanouts, the following are given:

Ts1=Td1=0.4 ns

Td2=0.53 ns

Ts2=0.67 ns

Figure 23:
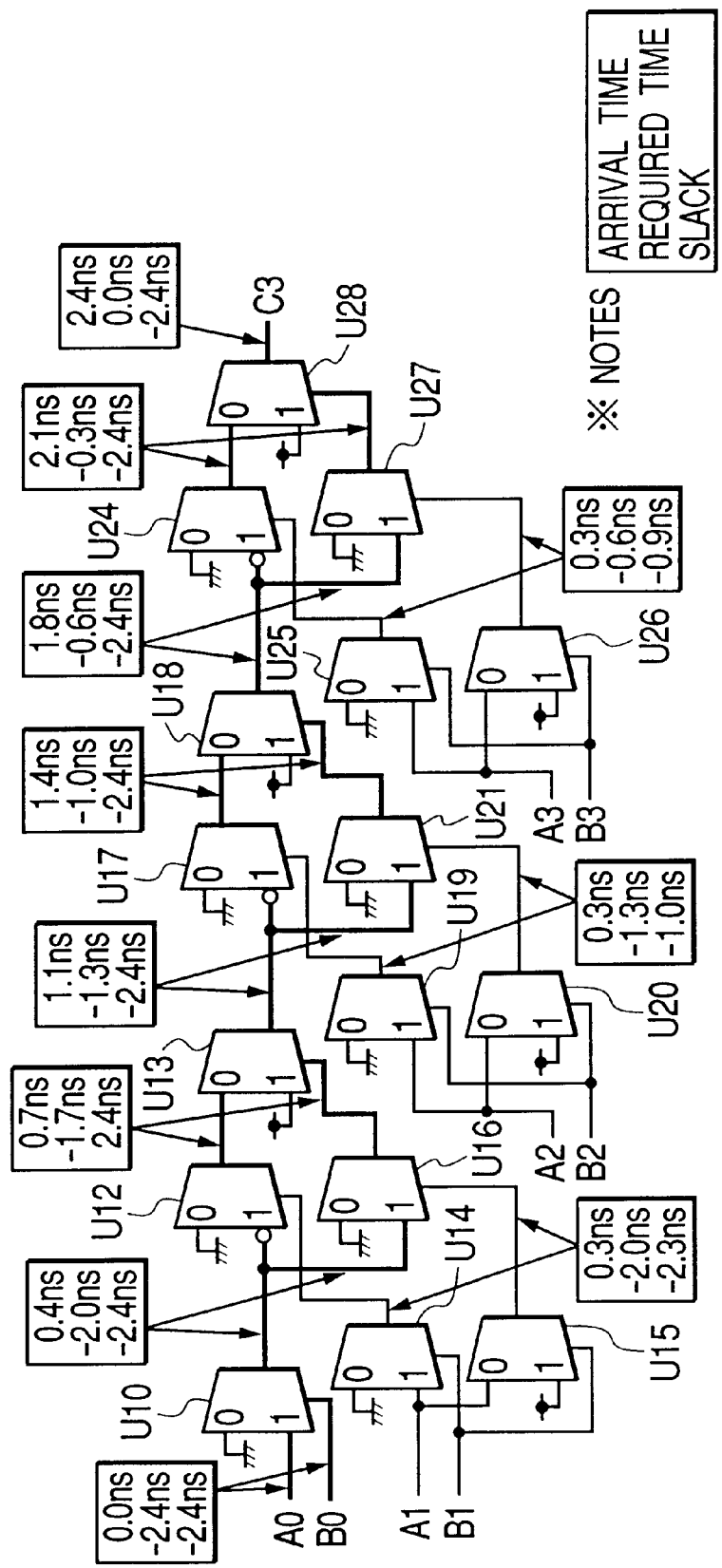
FIG. 23 shows the results of arrival time, required time, and slack calculations for the logic circuit in FIG. 21.

By delay calculation and slack calculation using this model, the result is obtained as is presented in FIG. 23.

Figure 24:
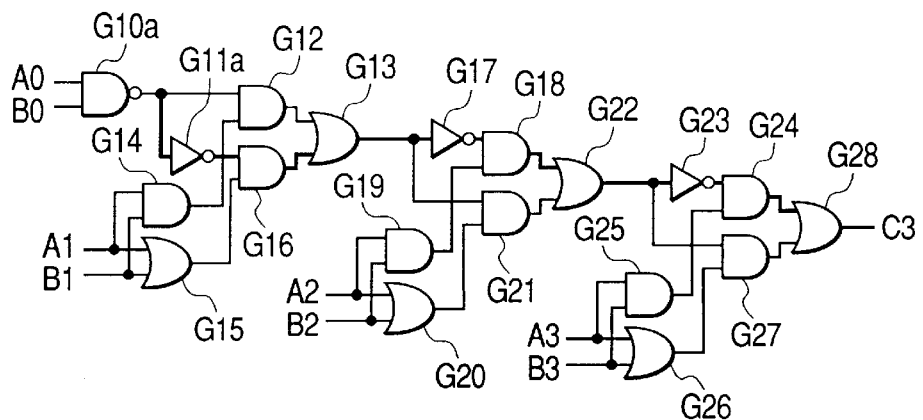
FIG. 24 is a circuit diagram where the G10 cell in the logic circuit in FIG. 19 is configured as a NAND gate with two inputs, not an AND gate with two inputs.

From the result in FIG. 23, it is seen that a critical path is routed from A0/B0→U10→U12/U16→U13→U17/U21→U18→U24/U27→U28→C3 and loops in three sections: U10→U12/U16→U13, U13→U17/U21→U18, and U18→U24/U27→U28. In the original circuit, a critical path is routed from A0/B0 G10→G11→G13→G17→G18→G22→G23→G24→G28→C3 without loop structure. As seen from the original circuit in FIG. 19, for example, a path routed from A0/B0→G10→G16→G13→G21→G22→G27→G28→C3 is substantially the same as the above critical path, though the inverters (G11, G17, G23) do not exist in this path. In fact, if, for example, G10 in FIG. 19 is changed to a 2NAND cell with the same logic function, a circuit is generated as is shown in FIG. 24 where an inverter is required at G16. This is also true for the relation between G18 and G21 and the relation between G24 and G27.

To improve the delay in this circuit, it is necessary to reduce the number of stages of a whole path from A0/B0→G10→G12/G16→G13→G18/G21→G22→G24/G27→G28→C3. By using the delay model shown in FIG. 14, which is proper to the present invention and estimates the inverter delay at 0, all paths for which delay improvement is required can be detected simultaneously as the loop sections of a critical path, and the number of stages of these paths can be reduced simultaneously by path depth reduction processing.

Next, the path depth reduction routine executes its process P122 for the thus detected critical path. The routine reduces the number of stages by using any of the path depth reduction methods a to e in FIG. 1. In the present example, because the critical path loops, the pattern a in FIG. 1 is preferably applied. In the circuit in FIG. 23, the pattern a in FIG. 1 is applied to the loop section U18→U24/U27→U28 where the slack difference between the looping critical path and any other path is greatest. A resulting circuit is obtained as shown in FIG. 25.

Figure 25:
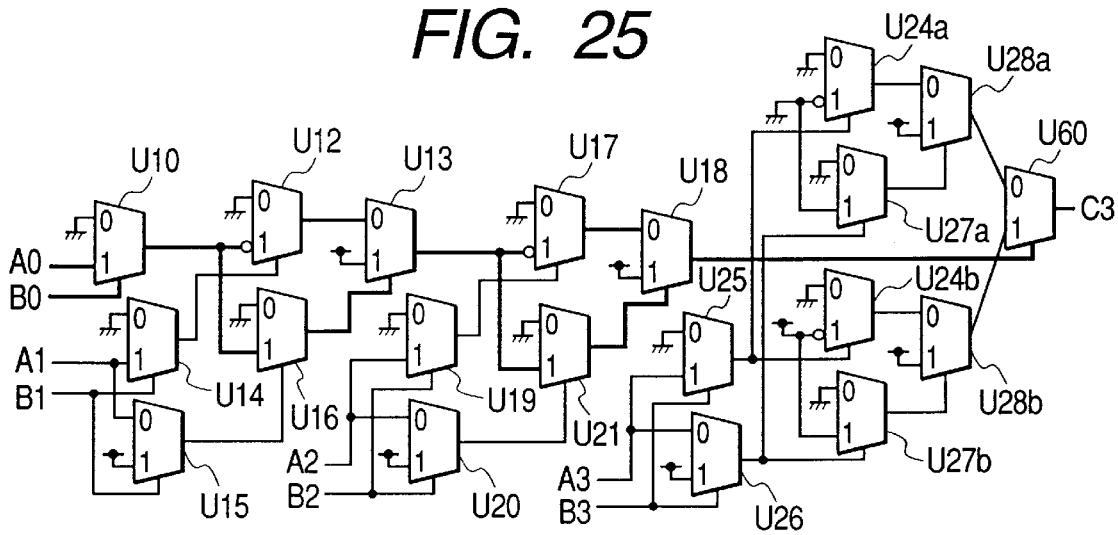
FIG. 25 is a diagram of an intermediate circuit to be generated during the execution of the path depth reduction routine of the delay reduction program of the present invention in FIG. 11.
Figure 26:
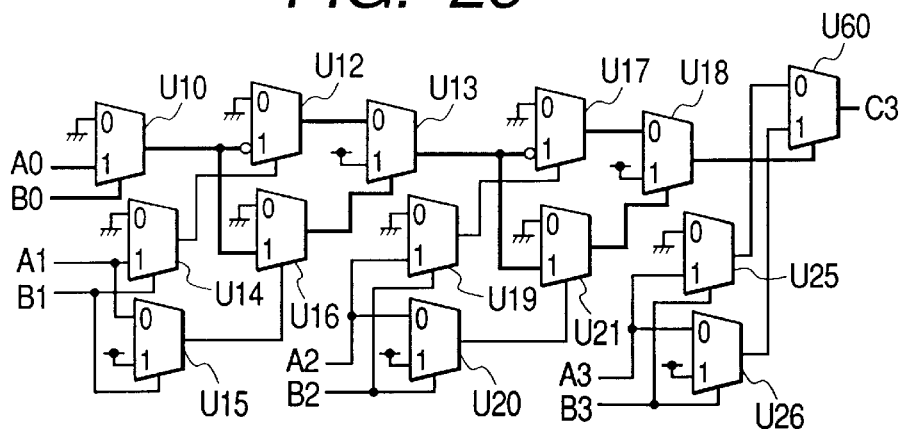
FIG. 26 is a diagram of another intermediate circuit to be generated during the execution of the path depth reduction routine of the delay reduction program of the present invention in FIG. 11.
Figure 27:
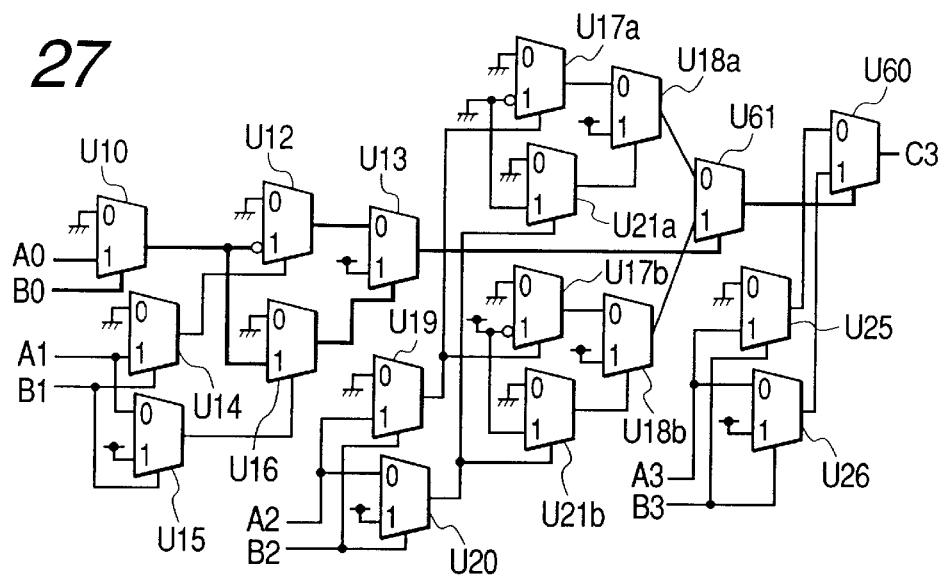
FIG. 27 is a diagram of another intermediate circuit to be generated during the execution of the path depth reduction routine of the delay reduction program of the present invention in FIG. 11.

In the FIG. 25 circuit, by simplifying the U24a, U27a, U24b, and U27b cells to which the patterns d and e in FIG. 8 are applicable, a circuit with six stages is generated as is shown in FIG. 26. In this circuit in FIG. 26, a path routed from A0/B0→U10→U12/U16→U13→U17/U21→U18→U60→C3 is detected as the critical path. In the circuit in FIG. 26, similarly, the pattern a in FIG. 1 is applied to the loop section formed by U13→U17/U21→U18. Then, a circuit which is shown in FIG. 27 is obtained, from which a circuit shown in FIG. 28 is obtained.

Figure 28:
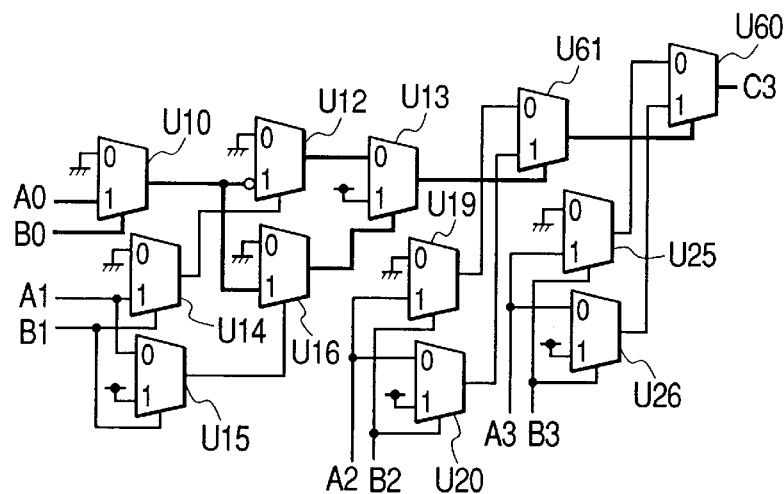
FIG. 28 is a diagram of another intermediate circuit to be generated during the execution of the path depth reduction routine of the delay reduction program of the present invention in FIG. 11.
Figure 29:
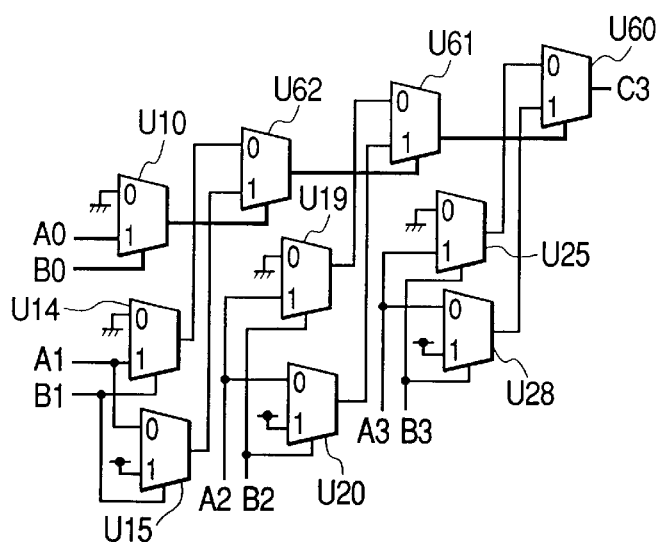
FIG. 29 is a diagram of another intermediate circuit to be generated during the execution of the path depth reduction routine of the delay reduction program of the present invention in FIG. 11.
Figure 30:
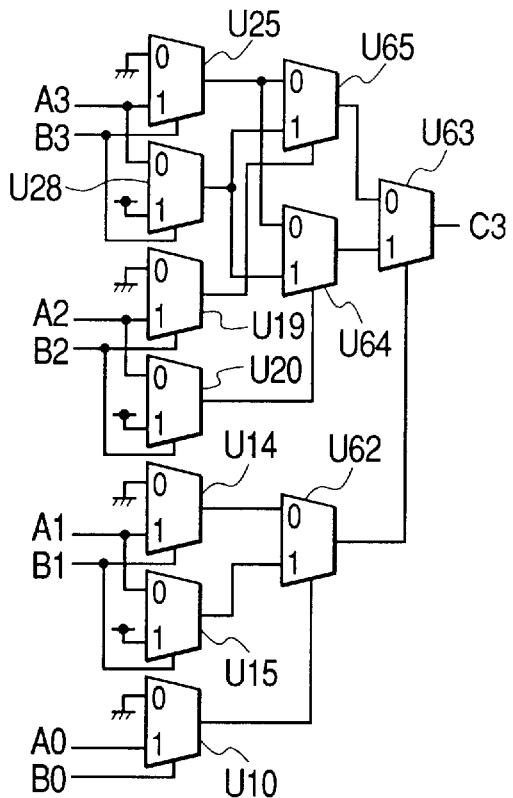
FIG. 30 is a diagram of a circuit that is output by the path depth reduction routine of the delay reduction program of the present invention in FIG. 11.

In the circuit in FIG. 28, the pattern a in FIG. 1 is applied to the loop section formed by U10→U12/U16→U13 and redundant selectors are removed. Then, a circuit is obtained as is shown in FIG. 29. In the circuit in FIG. 29, a path routed from A0/B0→U10→U62→U61→U60→C3 without a loop throughout it is detected as the critical path. Thus, the method of references 2 and 3 can be applied to this path. In the circuit in FIG. 29, by the application of the path depth reduction pattern d in FIG. 1 to the two-stage path from U61→U60 showing the greatest hole value, a circuit of three stages, comprising 11 selectors is eventually generated as is shown in FIG. 30. As shown in FIG. 30, a very compact circuit where all paths are equally three stages and 11 selectors exist is generated by the present invention.

Figure 31:
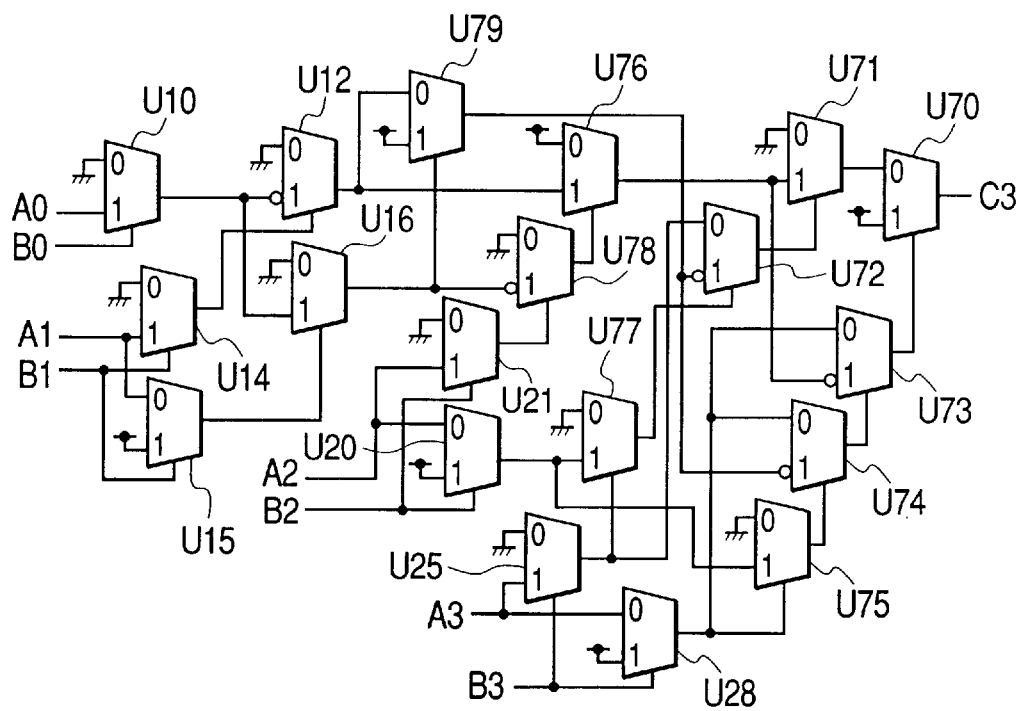
FIG. 31 is a diagram of a resultant circuit by the application of the path depth reduction processing introduced in references 2 and 3 to the logic circuit in FIG. 21.

On the other hand, by the application of only the conventional method of references 2 and 3 to the circuit in FIG. 21, a circuit of six stages comprising 19 selectors is generated as is shown in FIG. 31. As compared with the circuit in FIG. 30 generated by the application of the present invention, it is apparent that a complex circuit is generated in FIG. 31 where the number of stages of the paths is not equal and more selectors, namely 19 selectors, exist.

Although, in the above description, the comparison between the present invention and the conventional method was made for only the carry output C3 circuit portion extracted from the circuit comprising the adders, the result of such comparison for the entire circuit for example cases of 4-bit to 32-bit ripple-carry adders is tabulated in Table 1.

TABLE 1

|  | Method of reference 2 | | Application of the Invention | |
| --- | --- | --- | --- | --- |
| Adder | Number of stages | Number of selectors | Number of Stages | Number of Selectors |
| 4-bit | 6 | 56 | 3 | 20 |
| 8-bit | 7 | 162 | 4 | 82 |
| 16-bit | 8 | 406 | 5 | 139 |
| 32-bit | 9 | 976 | 6 | 331 |

As apparent from Table 1, in an entire 4-bit adder circuit generated by the method of the present invention, the number of selectors and the number of stages are one half or less of the selectors and stages in the corresponding circuit generated by the conventional method. Furthermore, from Table 1, it is seen that for any adder size, a circuit is generated where:

Number of stages=log2 (Number of inputs).

It is seen that a circuit of high quality comparable to adders which are manually optimized up to a high degree can be provided. It is evident that, by the combination of the method of the present invention and the conventional method in this way, a circuit for high-speed operation is generated with features including a decreased number of selectors and a reduced number of stages in the critical path.

(3) Mapping Program P200

The mapping program P200 makes an existing logic circuit synthesis tool read the netlist of the selector-based logic circuit D15 for which path depth reduction has been executed by the above routines (1) and (2) and generates a CMOS logic circuit having the corresponding logical function by using the cells existing in the library L10.

Because it is not probable that the selectors prepared as cell sets are in use as ordinary CMOS logic circuits as described above, the above routines (1) and (2) of the delay reduction program P100 offered by the present invention execute the path depth reduction processing by using "virtual selectors," independent of the library L10, equalize the number of stages of the paths in the circuit, and reduce the number of stages of the paths.

Figure 32:
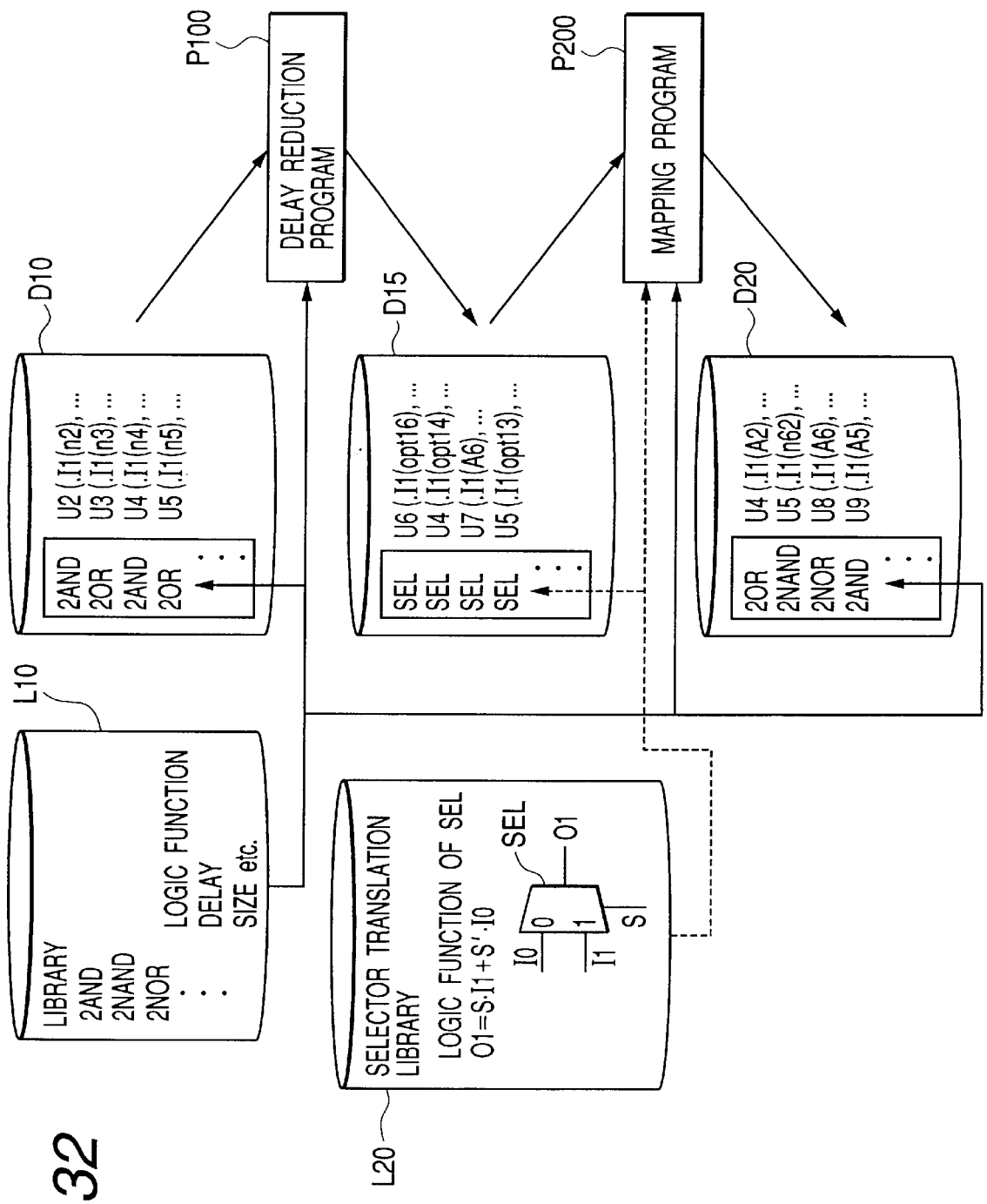
FIG. 32 shows the data flow in the delay reduction system of the present invention in FIG. 11.

The mapping program cannot read the logic circuit D15 netlist as is, because the selector cells specified in the logical circuit D15 netlist (for example, the SEL entries in the D15 netlist, shown in FIG. 32, are the names of virtual selector cells) do not exist in the library L10.

To solve this problem, in the mapping process in the present embodiment, the mapping program is run to first read the library L20 that stores the descriptions of only the logical functions of the selector cells used by the P100 program and then to read the logic circuit D15 netlist. After the logic circuit D15 netlist is properly loaded into the memory of the mapping program, the library L10 is loaded. The selector cells in the D15 logic circuit netlist are converted into the cells existing in the library L10. The mapping program controls logic circuit synthesis so that a logic circuit having the same logical function as the input circuit will be generated (see FIG. 32).

If the cells that function as the selectors exist in the library L10 and the logic circuit D15 netlist is created by using the selector cells existing in the library L10 instead of virtual selectors specific to the program P100 when the program P100 outputs the logic circuit D15, it is not necessary to prepare the special library L20 separate from the L10 library. However, in most cases, selector cells are not prepared in cell sets in the library L10 for ordinary CMOS logic circuits.

Even if the selector cells are prepared in the library L10, whenever the circuit design changes, the library is normally updated and the cell names of the cell sets change. For example, the cell name "SELECTOR" of a selector in one design may change to another name, for example, "AAA" in another design. With every design (library) change, the D15 netlist must also be changed to reflect the design change. Despite such troublesome maintenance, if the selector cells are removed from the library L10 due to cell set change, the mapping program cannot help using the separate library L20 containing the descriptions of logical functions of virtual selectors after all.

On the other hand, the method in which the separate library L20 is prepared to store the descriptions of logical functions of the selector cells of nets created by the delay reduction program P100 as used in the present embodiment. Even when the cell sets provided in the library L10 are updated, the mapping program looks up for a cell having the corresponding selector cell function described in the library L20 out of the new cell sets and automatically assigns the cell to the netlist. Thus, special processing for changing the netlist is not necessary. Used in this embodiment, the method that the separate library L20 is prepared is wider range of usage.

Figure 33:
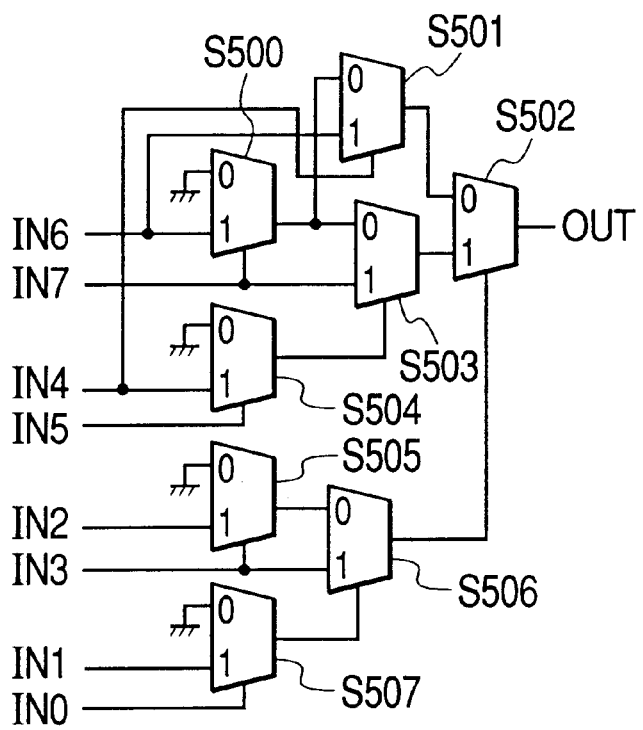
FIG. 33 is a diagram showing an example of a selector-based logic circuit for which path depth reduction processing has been completed to be input to the mapping program of the delay reduction system of the resent invention in FIG. 11.
Figure 34:
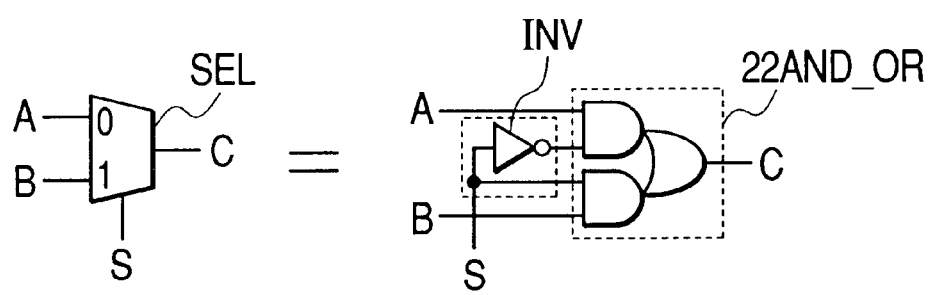
FIG. 34 is a diagram showing an example of a CMOS logic circuit configuration of equivalent logical function to a selector with two inputs and one output; the circuit is configured with a 22AND_OR complex gate with four inputs, shown in FIG. 12, and an inverter.

Processing that is proper to the mapping process is inputting a "don't-use-cell" list P210 to the mapping program as control parameters. Essentially, the mapping program creates logic circuits having their intended logical function by using all kinds of cells existing in the library L10. Thus, if a logic circuit, for example, as is shown in FIG. 33, is input to the mapping program, when, for example, such a cell (22AND_OR cell) exists that can replace a selector cell by adding one inverter to it as is shown in FIG. 34, such a circuit as C500 in column a in FIG. 35 where the selectors are simply replaced by the 22AND_OR cells and their inverter is often generated. This is because the input logic circuit in FIG. 33 is a circuit in which the number of stages of the paths is equal and no "obvious" critical path exists. Thus, only by translating the selectors to the 22AND_OR cells with their inverter, a CMOS logic circuit in which no obvious critical path exists is generated. At this time, the mapping program determines that there remains no room for further optimization and terminates the mapping process without executing the optimization based on the Boolean equation.

However, complex gates with four inputs or more such as 22AND_OR are actually stored in the library as those formed by four stages of serial CMOS transistors like the circuit C160 shown in FIG. 12, which have a considerably longer delay than the cells with two or three inputs (two times or more as long as the delay of 2NAND). Thus, even if a circuit including the 22AND_OR cells where the number of stages of the paths is equal and an obvious critical path does not exist is generated, it is probable that such a circuit is not necessarily optimal in terms of delay.

Figure 35:
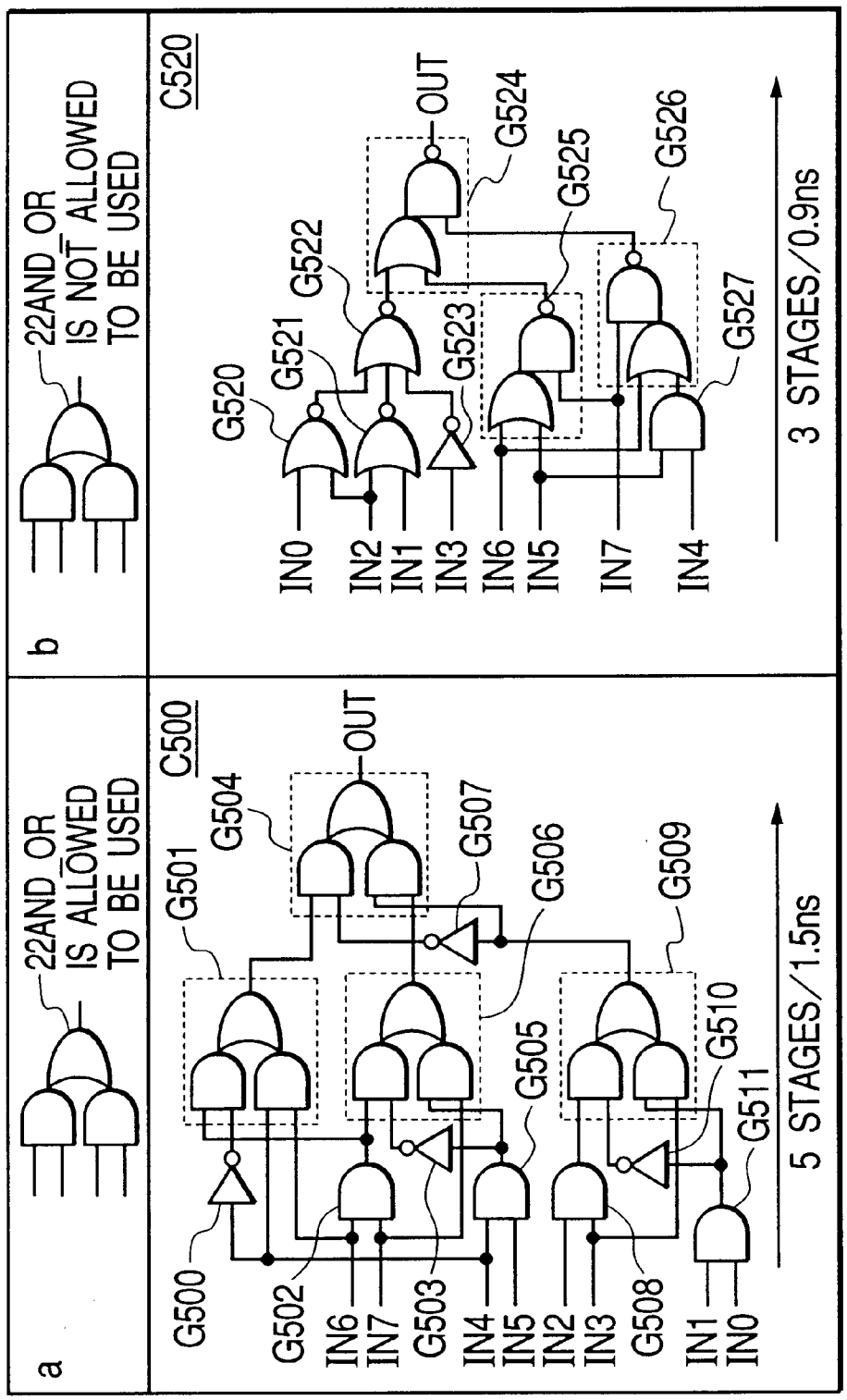
FIG. 35 shows an exemplary circuit to be generated by the mapping program to which the circuit in FIG. 33 is input and an exemplary circuit to be generated if the use of 22AND_OR complex gates is inhibited.

On the other hand, if the 22AND_OR cell is included in the don't-use-cell list P210 and the mapping program executes mapping without using this cell, a logic circuit is generated such as C520 shown in FIG. 35 where the number of stages is decreased with a reduced delay and the 22AND_OR cell of longer delay is not used at all. Because the use of the 22AND_OR cell is inhibited, the mapping program internal operation will preferably translate the selectors to combination circuits of a 21OR_NAND cell, for example, C150 shown in FIG. 12 and a NAND cell, for example, C110 in FIG. 12.

As compared with cases in which the 22AND_OR cell may be used, a circuit where the number of stages of the paths is not equal and longer delay occurs is temporarily generated. On the contrary, it is more likely that the mapping tool executes the Boolean equation level optimization and eventually generates a circuit of shorter delay. The input of the don't-use-cell list P210 to the mapping program activates more optimization processes, and consequently, the mapping program generates a circuit of shorter delay without utilizing a local optimization solution such as replacing the selector cells by 22AND_OR cells with inverters.

As explained above, the mapping program runs while referring to the library L20 containing the descriptions of logical functions of the selector cells and the don't-use-cell list P210 which are preferably part of the present invention, so that CMOS logic circuits of shorter delay can be generated.

Figure 11:
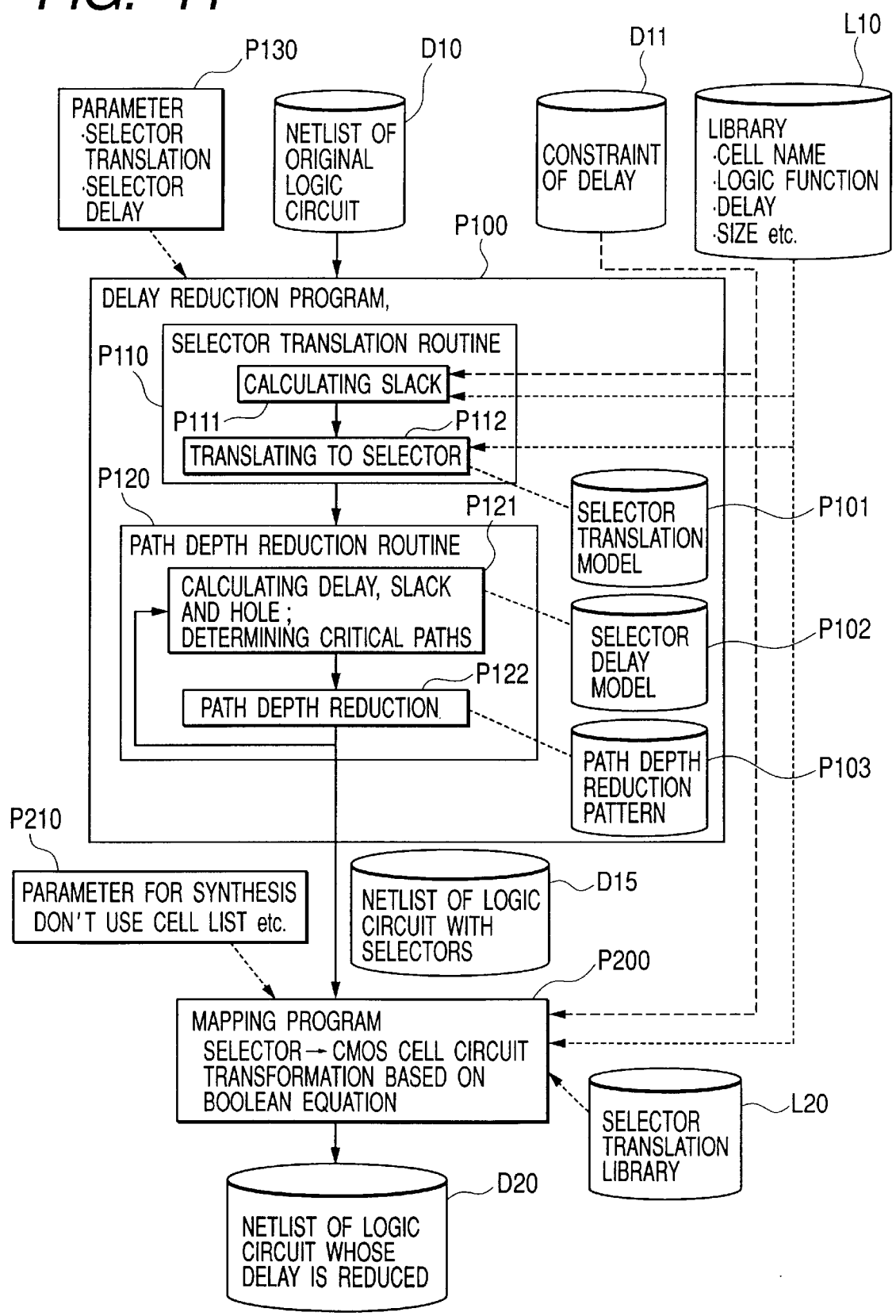
FIG. 11 is a flowchart illustrating how the delay reduction system of the present invention operates, using the delay reduction program.

Table 2 tabulates sample experimental results of the application of the delay reduction system offered by the present invention, shown in FIG. 11, to a large-scale logic circuit that is used as a practical microcontroller chip.

TABLE 2

|  | Conventional method | | Application of the invention | | Increase in |
| --- | --- | --- | --- | --- | --- |
|  | Area ($\mu m^2$) | Frequency (MHz) | Area ($\mu m^2$) | Frequency (MHz) | speed of the invention |
| CPU control | 15625 (1.00) | 190 (1.00) | 15635 (1.00) | 196 (1.03) | 3% |
| Cache control | 13134 (1.00) | 157 (1.00) | 12982 (0.99) | 186 (1.18) | 18% |

In Table 2, the values of the conventional method are the results of the maximum delay reduction by using only the existing logic circuit synthesis program based on Boolean equation which is exactly the same as used by the mapping program P200 in FIG. 11. In this Table, not only the delay but also the maximum operating frequency which is the reciprocal to the delay are used for performance comparison. As apparent from the Table, the delay reduction method of the present invention successfully generates a logic circuit that operates about 20% faster the corresponding one generated by using only the existing logic circuit synthesis tool.

Third Exemplary Embodiment

As explained generally above, in the delay reduction method of the present invention which eventually maps (translates) the selectors into the corresponding gates on a CMOS logic circuit, it is preferable to correctly detect a path that will become a critical path in the CMOS logic circuit to be generated after mapping and sufficiently reduce the stages of the critical path using the path depth reduction processing based on the selectors. It is therefore also preferable to accurately adjust the parameters of the selector-based delay model. However, because these parameters change during library updates as described above, it may be difficult to provide the most accurate parameter sets at any given time.

Figure 36:
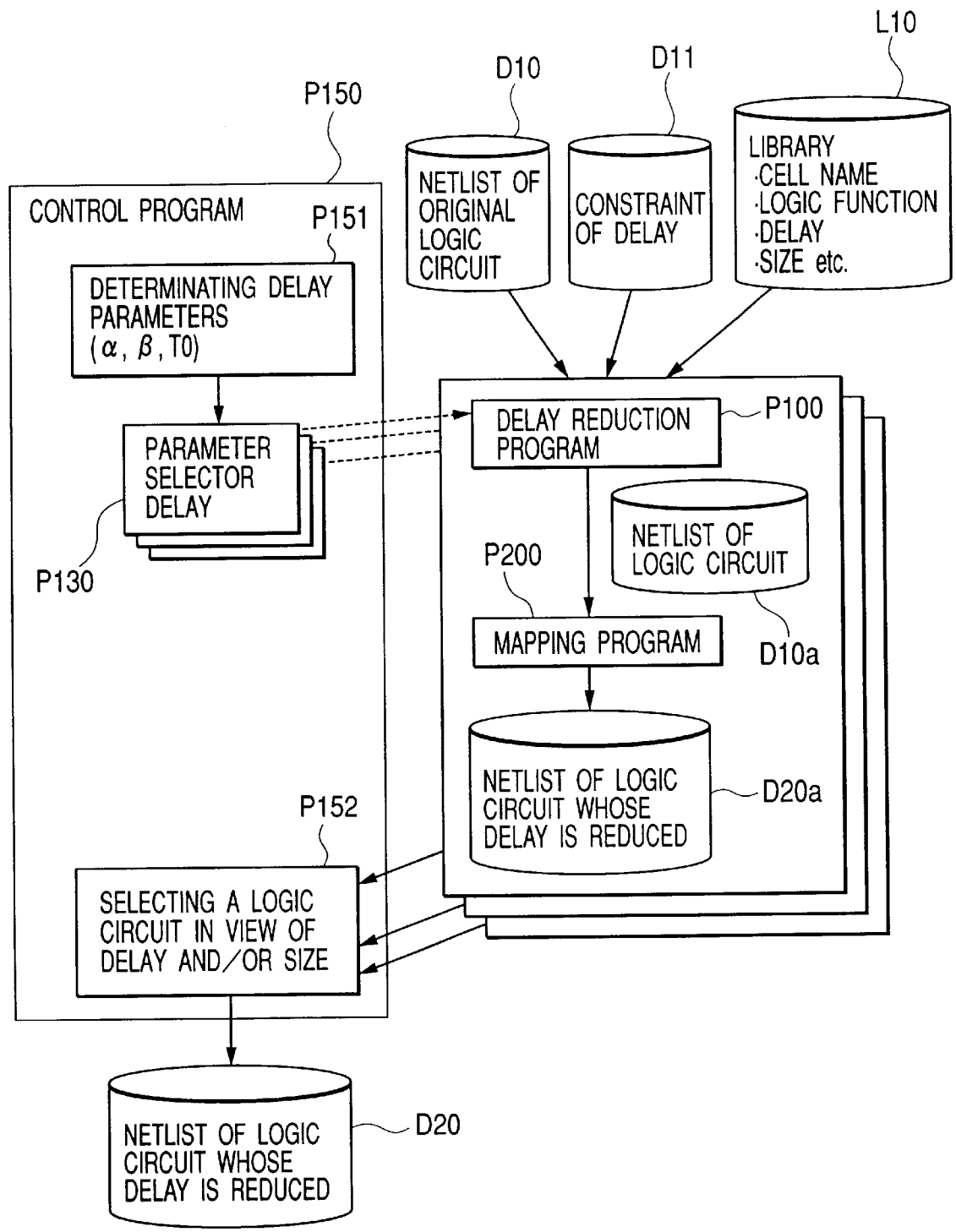
FIG. 36 shows the outline of a delay reduction system according to a preferred embodiment of the present invention.

To address this problem, the present invention includes another delay reduction method which is presented in FIG. 36. Here, a control program P150 generates a plurality of sets of parameters; the values of delay parameters $\alpha$, $\beta$, and T0 vary in a given range (process P151). Thereafter, these generated parameters are input to the delay reduction system in FIG. 11 explained above, the delay reduction program P100 is run, and then the CMOS logic circuit is mapped with the mapping program P200. Finally, out of a plurality of resulting circuits thus generated by mapping, the control program selects a circuit of optimum circuit characteristics such as delay, area, etc. (which are preferably predetermined) and outputs the selected logic circuit (process P152 of the control program P150).

Figure 37:
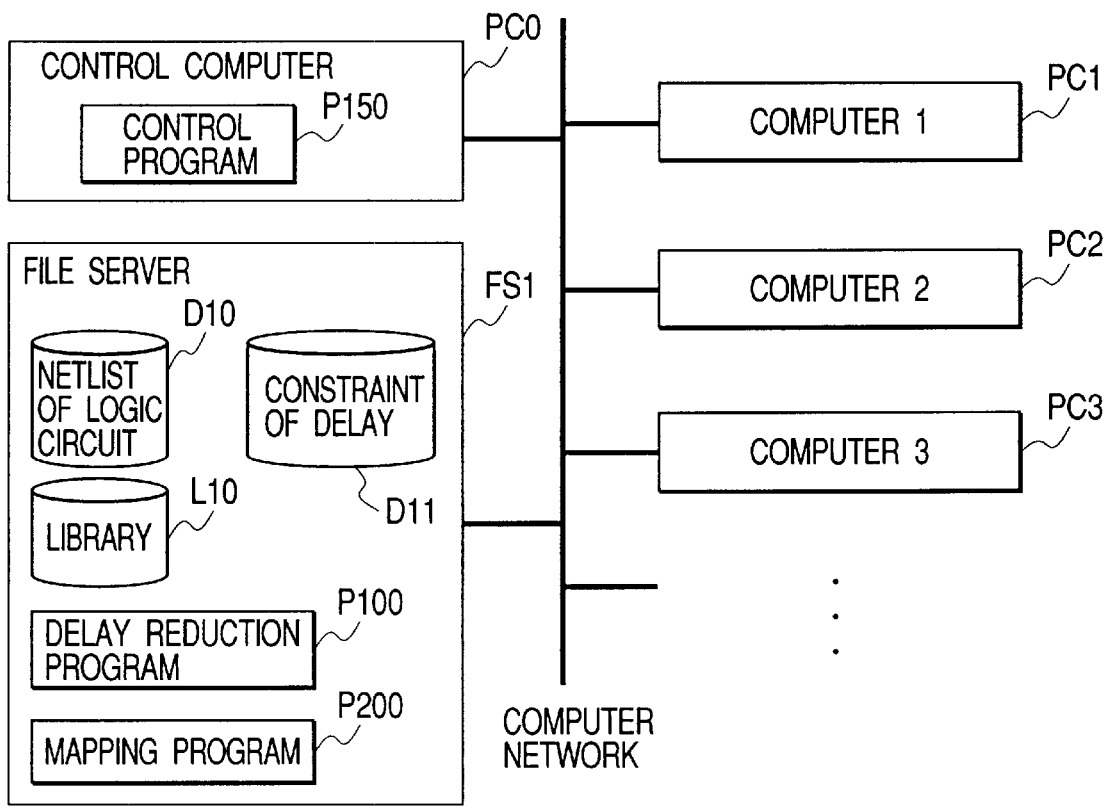
FIG. 37 shows an example of a computer networking system configuration for executing the delay reduction system in FIG. 36.

By controlling the delay reduction system in FIG. 11 in this way, it may be possible to achieve greater performance in the resulting circuit if the parameter setting range is properly set. In this method, optimization processing is preferably repeated as many times as the number of the specified parameter sets which may require additional processing time, according to simple estimation. However, if a plurality of computers on which the above system is run are interconnected via a local area network and used for distributed processing of circuit design optimization, as is shown in FIG. 37, the resulting optimized circuit may be obtained in almost the same processing time as the time required for executing the system in the second exemplary embodiment. By implementing the present invention in the method illustrated in FIGS. 36 and 37, high-speed logic circuits with decreased delay can be provided in a processing time equivalent to the time required for executing the system of the second exemplary embodiment.

The present invention is not limited to the above embodiments and various changes and modifications can be made within the spirit and scope of the present invention. Therefore, to apprise the public of the scope of the present invention, the following claims are made.

Nothing in the above description is meant to limit the present invention to any specific materials, geometry, or orientation of elements. Many part/orientation substitutions are contemplated within the scope of the present invention and will be apparent to those skilled in the art. The embodiments described herein were presented by way of example only and should not be used to limit the scope of the invention.

Although the invention has been described in terms of particular embodiments in an application, one of ordinary skill in the art, in light of the teachings herein, can generate additional embodiments and modifications without departing from the spirit of, or exceeding the scope of, the claimed invention. Accordingly, it is understood that the drawings and the descriptions herein are proffered by way of example only to facilitate comprehension of the invention and should not be construed to limit the scope thereof.

What is claimed is:

1. A logic circuit design method for designing a logic circuit utilizing a computer system with a library in which delay information and logical function information about a group of cells constituting a CMOS logic circuit have been stored, said design method comprising the steps of:

inputting a first logic circuit comprising a plurality of gates;

generating a second logic circuit by replacing the gates of said first logic circuit by logically equivalent functional selectors having two inputs and one output;

generating a third logic circuit by modifying said second logic circuit to reduce the number of stages of paths within said second logic circuit; and outputting a fourth logic circuit generated by mapping said third logic circuit to a CMOS logic circuit through the use of said library, wherein said mapping is executed with a condition of inhibiting the use of some of the cells existing in said library.

2. The logic circuit design method according to claim 1, wherein said condition is inhibiting the use of complex cells with at least four inputs.

3. The logic circuit design method according to claim 1, wherein the delay through each of said selectors may be set according to factors selected from the group consisting of: fanning out of additional selectors at the output, connection of the first or second selector input to a first operating potential point, and connection of the first or second selector input to a second operating potential point.

4. The logic circuit design method according to claim 1, wherein said step of generating a third logic circuit, further comprises the steps of:

detecting a first node at which at least one path within said second logic circuit diverges into a first branch path and a second branch path;

detecting a second node at which said first and second branch paths converge;

detecting a first local circuit comprising a plurality of selectors having two inputs and one output along said first and second branch paths; and generating a third logic circuit with a reduced number of stages of paths within said second logic circuit by replacing said first local circuit with a local circuit selector which has two inputs and one output and is logically equivalent to said first local circuit, wherein a control signal S of said local circuit selector is controlled by said first node, the first input I0 of said local circuit selector is controlled by a first circuit that is formed by inputting a logical value of "0" to the first node in said first local circuit, and the second input I1 of said selector is controlled by a second circuit that is formed by inputting a logical value of "1" to said first node in said first local circuit.

5. The logic circuit design method according to claim 4, wherein said critical path is detected by using a delay model in which the delay of a first selector having two inputs and one output with each of the two inputs not fixed to a first or second operating potential point is set at approximately 1.0 to approximately 3.0 times as long as the delay of a second selector having two inputs and one output with at least one of the two inputs of the second selector fixed to the first or second operating potential point.

6. A logic circuit design method for designing a logic circuit utilizing a computer system with a first library in which delay information and logical function information about a group of cells constituting a CMOS logic circuit have been stored, said design method comprising the steps of:

inputting a first logic circuit comprising a plurality of gates;

generating a second logic circuit by replacing the gates of said first logic circuit by logically equivalent functional selectors having two inputs and one output;

generating a third logic circuit by modifying said second logic circuit to reduce the number of stages of at least a critical path within said second logic circuit; and outputting a fourth logic circuit generated by mapping said third logic circuit to a CMOS logic circuit through the use of said first library and a second library containing the descriptions of the names, logical functions, and pin names of said selector cells having two inputs and one output, wherein the CMOS logic circuit has the same logical function as the logic circuit consisting of said selectors having two inputs and one output.

7. The logic circuit design method according to claim 6, wherein said critical path is detected by using a delay model in which the delay of a first selector having two inputs and one output is proportional to the number of additional selectors having two inputs and one output connected to the output of the first selector.

8. The logic circuit design method according to claim 6, wherein said critical path is detected by using a delay model in which the delay of a first selector having two inputs and one output wherein each of said two inputs is not fixed to a first or second operating potential point, is longer than the delay of a second selector having two inputs and one output with at least one of the two inputs of the second selector fixed to said first or said second operating potential point.

9. The logic circuit design method according to claim 6, wherein said critical path is detected by using a delay model in which the delay of a signal from the control input of a selector having two inputs and one output with both inputs not fixed to either a first or second operating potential point is longer than the delay of a signal from each of the two inputs of the selector.

10. The logic circuit design method according to claim 6, wherein said critical path is detected after the delay throughout the circuit is calculated, wherein the delay of the inverters used for polarity inversion is negligible.

11. The logic circuit design method according to claim 6, all wherein said critical path is detected by using a delay model in which the delay of a signal from the control input of a selector having two inputs and one output with each of the two inputs not fixed to a first or second operating potential point is set at approximately 1.0 to approximately 3.0 times as long as the delay of a signal from each of the two inputs of the selector.

12. The logic circuit design method according to claim 6, wherein the step of transforming said first circuit into the second circuit, comprises the steps of:

calculating the delay of said first logic circuit, calculating the slack value of each input pin of all gates in the first circuit, and replacing the input pin of the least slack value of each gate with one of said two inputs of the corresponding selector of two inputs and one output.

13. The logic circuit design method according to claim 6, wherein the step of transforming said first circuit into the second circuit, comprises the steps of:

calculating the delay of said first logic circuit;

calculating the slack value of each input pin of all gates in the first circuit; and translating a logic gate having at least three inputs into a circuit comprising at least two selectors having two inputs and one output with the input pin of the least slack of said gate assigned to the selector stage nearest to the output, wherein said logic gate is selected from the group consisting of AND, OR, NAND, and NOR.

14. The logic circuit design method according to claim 6, wherein path depth reduction processing based on selectors is executed for said first logic circuit, conditioned by various values of setting of:

a ratio of the delay of a first selector having two inputs and one output with both inputs not being fixed to a first or second operating potential point to the delay of a second selector having two inputs and one output with at least one of the two inputs of the second selector being fixed to said first or second operating potential point; and a ratio of the delay of a signal from the control signal of a third selector having two inputs and one output with both inputs not being fixed to said first or second operating potential point to the delay of a signal from at least one of said two inputs of the third selector, wherein a plurality of logic circuits are generated comprising selectors having two inputs and one input, further wherein an optimal circuit is selected from said plurality of generated logic circuits based on the number of stages and the number of selectors, and said selected logic circuit is mapped to a CMOS logic circuit.

15. The logic circuit design method according to claim 6, wherein path depth reduction processing based on selectors is executed for said first logic circuit, conditioned by various values of setting of:

a ratio of the delay of a first selector having two inputs and one output with both inputs not being fixed to a first or second operating potential point to the delay of a second selector having two inputs and one output with at least one of the two inputs of the second selector being fixed to said first or second operating potential point; and a ratio of the delay of a signal from the control signal of a third selector having two inputs and one output with both inputs not being fixed to said first or second operating potential point to the delay of a signal from at least one of said two inputs of the third selector, wherein a plurality of logic circuits are generated comprising selectors having two inputs and one output, further wherein said generated logic circuits are mapped to CMOS logic circuits, out of which an optimal circuit is selected and output based on predetermined circuit characteristics selected from the group consisting of: delay, area, and operation frequency.

16. The logic circuit design method according to claim 6, wherein a plurality of computers are used and path depth reduction processing and mapping processing are distributed and executed among said computers.

17. A logic circuit design method for designing a logic circuit by a computer system, comprising:

inputting a first logic circuit comprising a plurality of gates;

generating a second logic circuit by replacing the gates of said first logic circuit by logically equivalent functional selectors having two inputs and one output;

detecting a first node at which at least one path within said second logic circuit diverges into a first branch path and a second branch path;

detecting a second node at which said first and second branch paths converge;

detecting a first local circuit comprising a plurality of selectors having two inputs and one output along said first and second branch paths; and generating a third logic circuit with a reduced number of stages of paths within said second logic circuit by replacing said first local circuit with a local circuit selector which has two inputs and one output and is logically equivalent to said first local circuit, wherein a control signal S of said local circuit selector is controlled by said first node, the first input I0 of said local circuit selector is controlled by a first circuit that is formed by inputting a logical value of "0" to the first node in said first local circuit, and the second input I1 of said selector is controlled by a second circuit that is formed by inputting a logical value of "1" to said first node in said first local circuit.

18. The logic circuit design method according to claim 17, wherein a critical path of longest delay out of the paths within said second logic circuit is detected and said first local circuit along said critical path is detected.

19. The logic circuit design method according to claim 17, further comprising the step of:

outputting a fourth logic circuit generated by mapping said third logic circuit to a CMOS logic circuit through the use of a library in which delay information and logical function information about a group of cells constituting a CMOS logic circuit have been stored, wherein said mapping is executed with a condition of inhibiting the use of some of the cells existing in said library.

* * * * *